(12) United States Patent
Majima et al.

(10) Patent No.: US 11,894,281 B2
(45) Date of Patent: Feb. 6, 2024

(54) SEMICONDUCTOR DEVICE INCLUDING LEAD WITH VARYING THICKNESS

(71) Applicant: Rohm Co., Ltd., Kyoto (JP)

(72) Inventors: Ryota Majima, Kyoto (JP); Koshun Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 245 days.

(21) Appl. No.: 17/370,596

(22) Filed: Jul. 8, 2021

(65) Prior Publication Data

US 2021/0335683 A1    Oct. 28, 2021

Related U.S. Application Data

(63) Continuation of application No. 16/560,493, filed on Sep. 4, 2019, now Pat. No. 11,088,043.

(30) Foreign Application Priority Data

Sep. 5, 2018   (JP) ................. 2018-165722

(51) Int. Cl.
*H01L 23/31*    (2006.01)
*H01L 23/495*   (2006.01)

(52) U.S. Cl.
CPC ........ *H01L 23/315* (2013.01); *H01L 23/4952* (2013.01)

(58) Field of Classification Search
CPC .............. H01L 23/315; H01L 23/4952; H01L 23/3107; H01L 23/562; H01L 2224/0603;

(Continued)

(56) References Cited

U.S. PATENT DOCUMENTS

| 5,821,611 A | 10/1998 | Kubota et al. |
| 2003/0189222 A1 | 10/2003 | Itou et al. |

(Continued)

FOREIGN PATENT DOCUMENTS

| JP | 2005-191240 A | 7/2005 |
| JP | 2006-19465 A | 1/2006 |

(Continued)

OTHER PUBLICATIONS

Office Action received in the corresponding Japanese Patent application, dated Jul. 12, 2022, and machine translation.

(Continued)

*Primary Examiner* — John P. Dulka
(74) *Attorney, Agent, or Firm* — Hamre, Schumann, Mueller & Larson, P.C.

(57) ABSTRACT

A semiconductor device includes a semiconductor element, a first lead electrically connected to the semiconductor element, a sealing resin that covers the semiconductor element and a part of the first lead, and a recess formed in a surface flush with a back surface of the sealing resin. The sealing resin also has a front surface opposite to the back surface in a thickness direction, and a side surface connecting the front surface and the back surface to each other. The recess is formed, in part, by a part of the first lead that is exposed from the back surface of the sealing resin. The recess has an outer edge that forms a closed shape, as viewed in the thickness direction, within a region that includes the back surface of the sealing resin and the first lead.

17 Claims, 23 Drawing Sheets

(58) Field of Classification Search
CPC . H01L 2224/48091; H01L 2224/48247; H01L 2224/48465; H01L 2224/49111; H01L 2224/49431; H01L 2924/181; H01L 2924/18301; H01L 23/49541; H01L 23/49548; H01L 23/49555; H01L 23/49582; H01L 23/49562; H01L 2924/00014; H01L 2924/00012
See application file for complete search history.

(56) References Cited

U.S. PATENT DOCUMENTS

| | | | |
|---|---|---|---|
| 2005/0139982 A1* | 6/2005 | Fukaya | H01L 24/97 257/692 |
| 2014/0001616 A1 | 1/2014 | Daniels et al. | |
| 2015/0091144 A1 | 4/2015 | Taguchi | |
| 2017/0213782 A1 | 7/2017 | Iwai | |
| 2017/0316997 A1 | 11/2017 | Saito | |
| 2021/0082792 A1 | 3/2021 | Chen et al. | |

FOREIGN PATENT DOCUMENTS

| | | |
|---|---|---|
| JP | 2006-179760 A | 7/2006 |
| JP | 2013-069720 A | 4/2013 |
| JP | 2016-27614 A | 2/2016 |
| JP | 2017-135241 A | 8/2017 |
| JP | 2019-47061 A | 3/2019 |

OTHER PUBLICATIONS

Office Action received in the corresponding Japanese Patent application, Dec. 5, 2023, and machine translation (8 pages).

* cited by examiner

SEMICONDUCTOR DEVICE INCLUDING LEAD WITH VARYING THICKNESS

FIELD

The present disclosure relates to a semiconductor device.

BACKGROUND

Conventional semiconductor devices, incorporating semiconductor elements such as transistors, are available in various configurations. JP-A-2013-69720, for example, discloses a semiconductor device including a semiconductor element, a plurality of leads and a sealing resin. The incorporated semiconductor element is mounted on one of the leads and electrically connected to the leads. The sealing resin covers the semiconductor element and a part of each lead. The portions of the leads that are exposed from the back surface and the side surface of the sealing resin provide terminal parts. In mounting the semiconductor device to a circuit board, the terminal parts are bonded to a circuit wiring on the circuit board by soldering. Bonding surfaces of such terminal parts are becoming smaller in response to the increasing demand for smaller semiconductor devices. When such a semiconductor device with terminal parts having small bonding surfaces are subjected to rapid temperature changes in use, solder may crack or come off the terminal parts due to thermal stress, which may result in a bonding failure.

SUMMARY

The present disclosure has been proposed under the above-noted circumstances, and an object of the present disclosure is to provide a semiconductor device that is capable of preventing solder from cracking or separating from a terminal part in spite of thermal stress.

According to an aspect of the present disclosure, there is provided a semiconductor device including: a semiconductor element; a first lead electrically connected to the semiconductor element; a sealing resin that covers the semiconductor element and a part of the first lead, where the sealing resin includes a resin front surface, a resin back surface opposite to the resin front surface in a thickness direction, and a resin side surface connecting the resin front surface and the resin back surface to each other; and at least one recess formed in a surface that is flush with the resin back surface. The recess may be formed at least by a part of the first lead that is exposed from the resin back surface. The recess has an outer edge that forms a closed shape, as viewed in the thickness direction, within a region that includes the resin back surface and the first lead.

With the above arrangements, a semiconductor device is provided with a recess formed at least by a part of the first lead exposed from the sealing resin. Thus, in bonding the first-lead to a circuit wiring using solder, a part of the solder is formed in the recess. This can contribute to reducing formation of a crack in the solder or separation of the solder from the first lead due to thermal stress.

Other features and advantages of the present disclosure will become apparent from the detailed description given below with reference to the accompanying drawings.

DRAWINGS

EMBODIMENTS

Embodiments of the present disclosure are described below with reference to the accompanying drawings.

A semiconductor device A1 according to a first embodiment of the present disclosure is described below with reference to FIGS. 1-11. The semiconductor device A1 includes a plurality of leads 1-3, a semiconductor element 6, bonding wires 71, 72 and a sealing resin 8.

Figure 1:
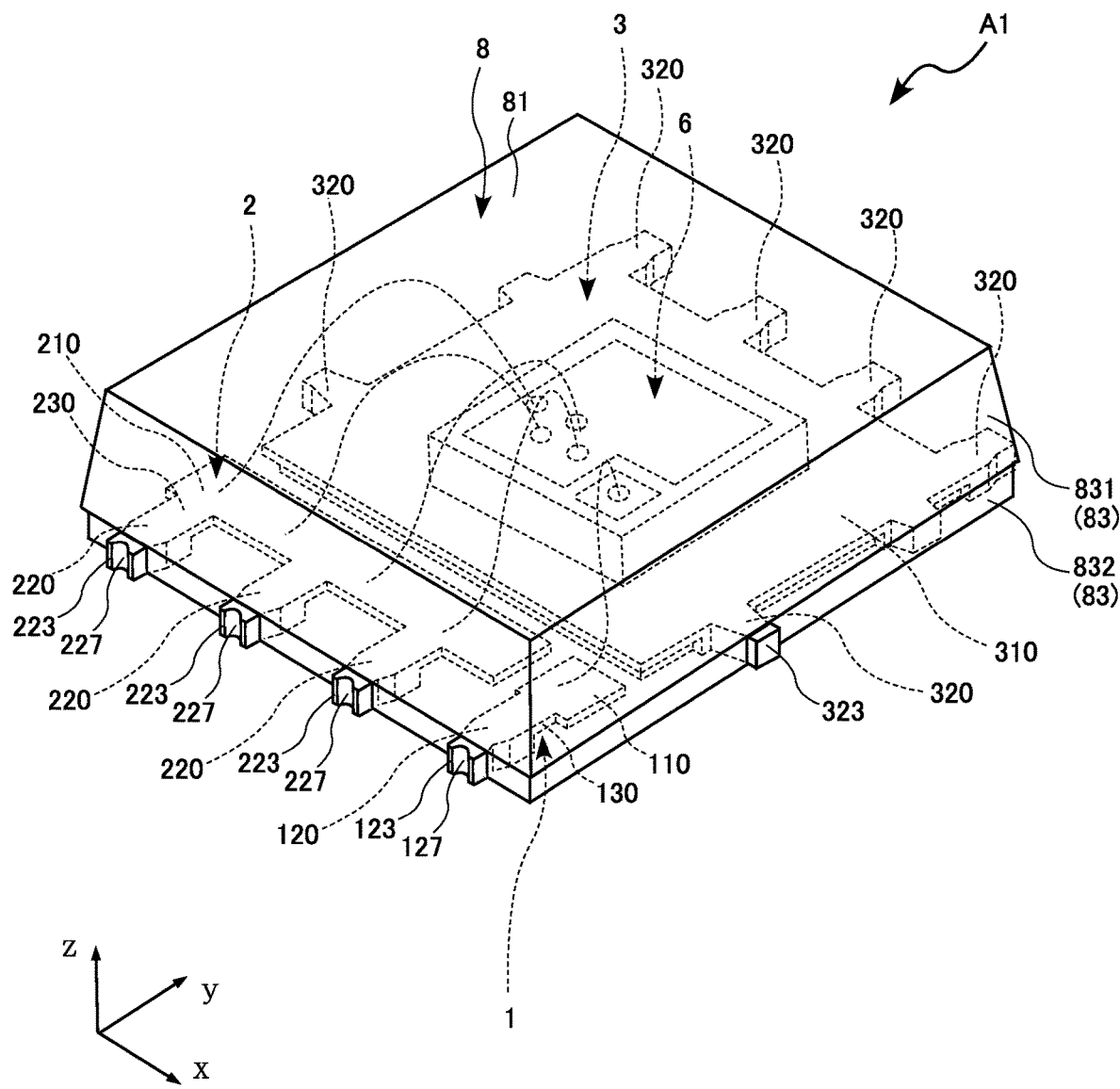
FIG. 1 is a perspective view showing a semiconductor device according to a first embodiment of the present disclosure.
Figure 2:
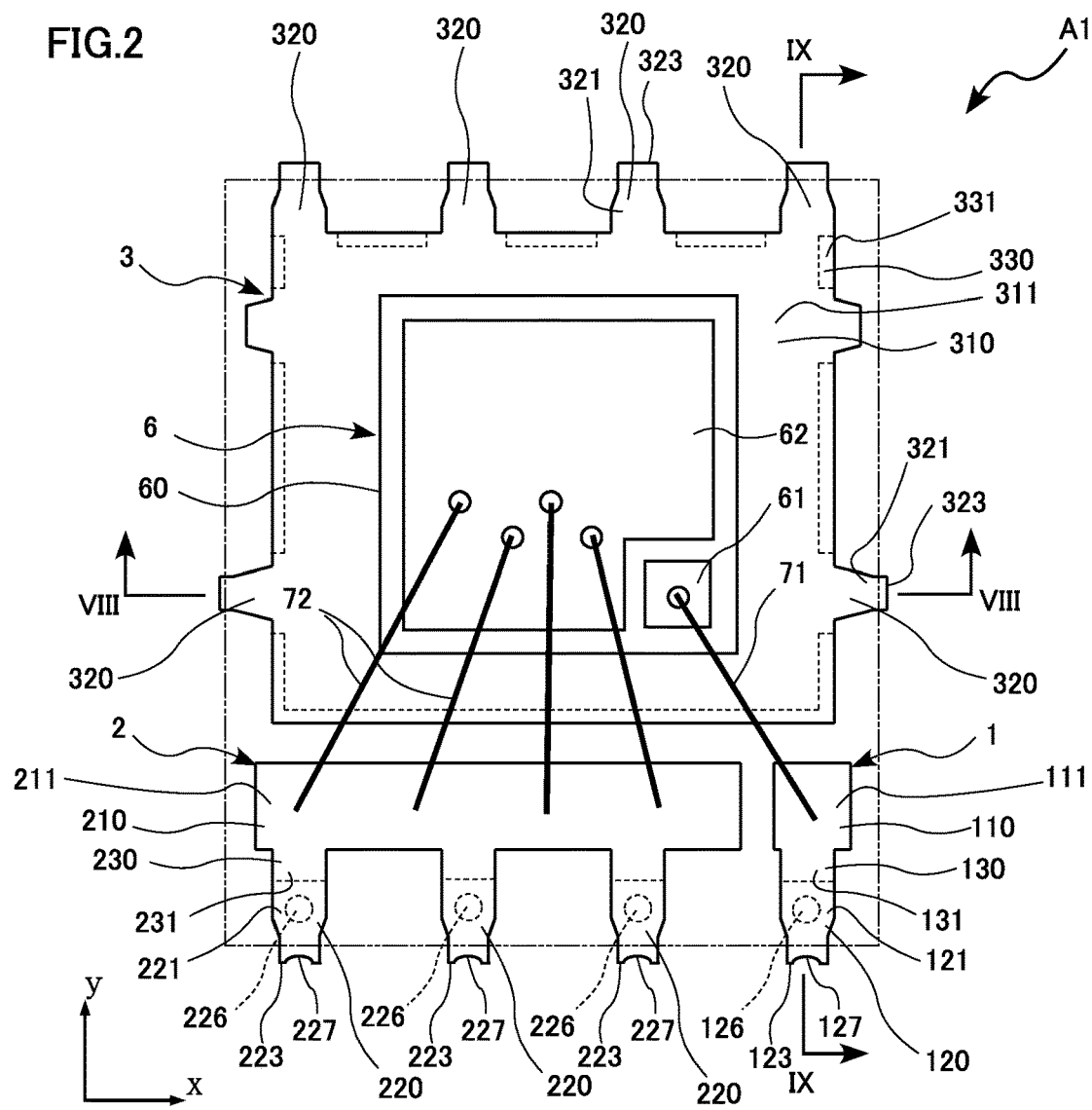
FIG. 2 is a plan view of the semiconductor device shown in FIG. 1.
Figure 3:
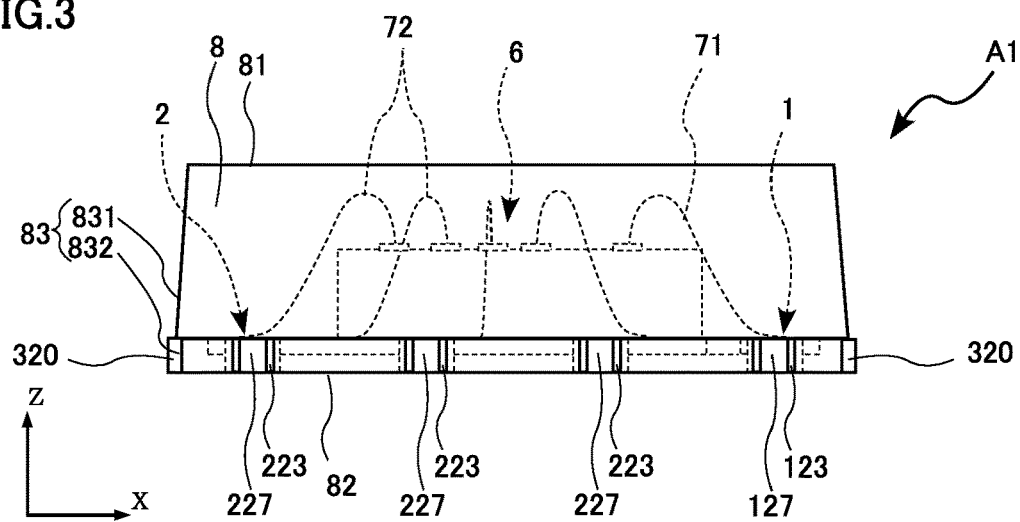
FIG. 3 is a front view of the semiconductor device shown in FIG. 1.
Figure 4:
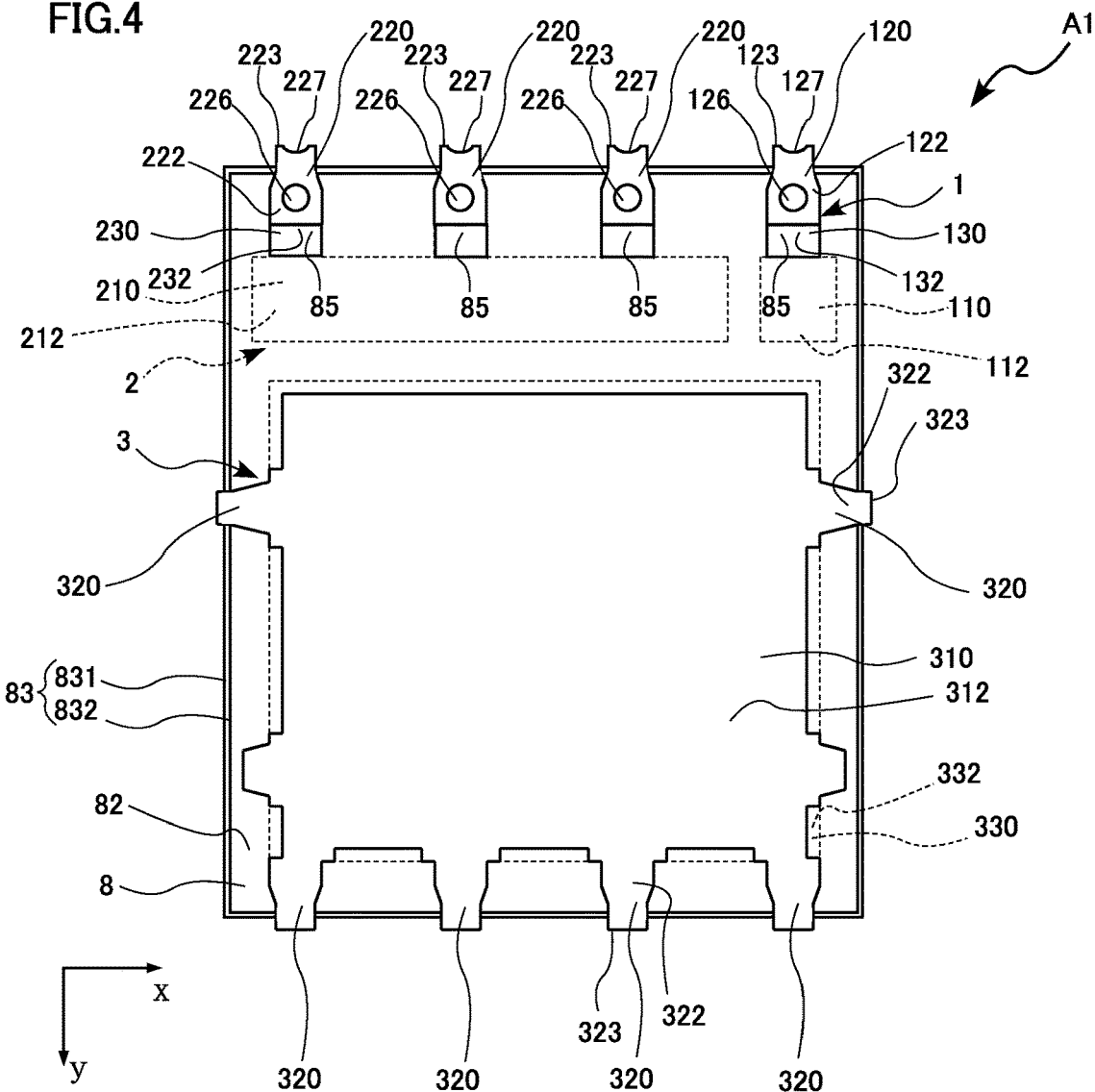
FIG. 4 is a bottom view of the semiconductor device shown in FIG. 1.
Figure 5:
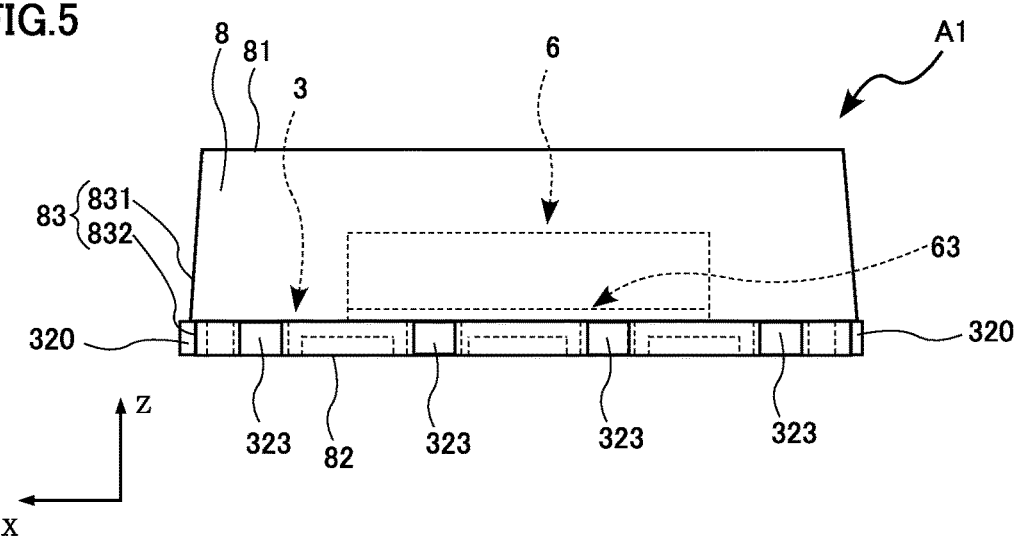
FIG. 5 is a rear view of the semiconductor device shown in FIG. 1.
Figure 6:
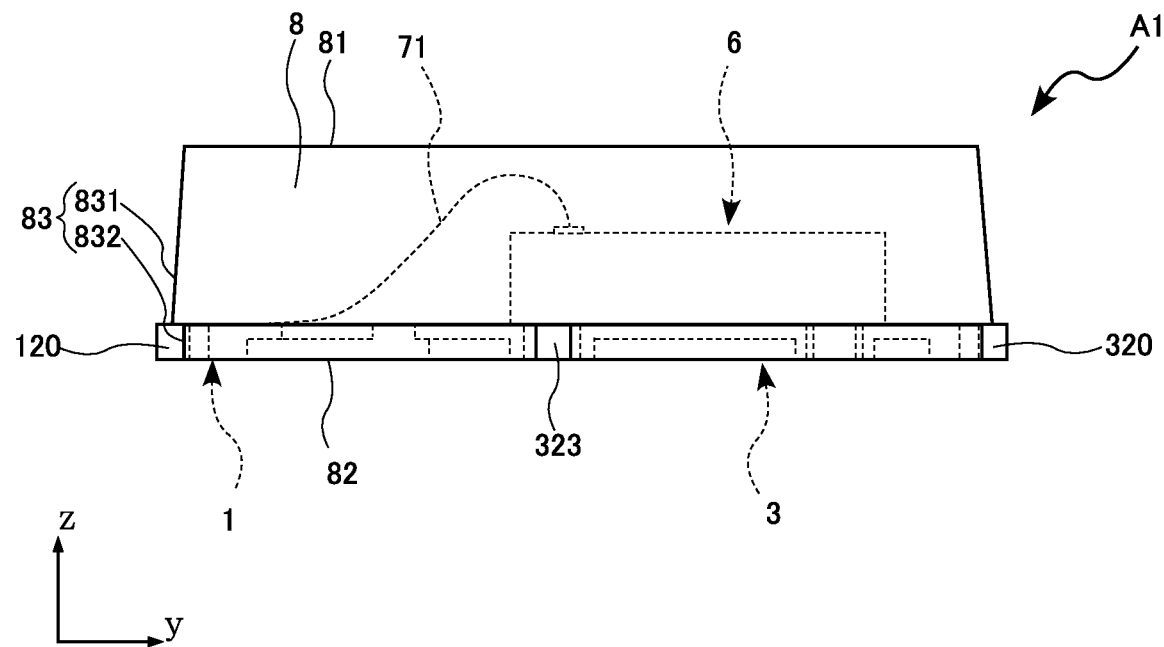
FIG. 6 is a right side view of the semiconductor device shown in FIG. 1.
Figure 7:
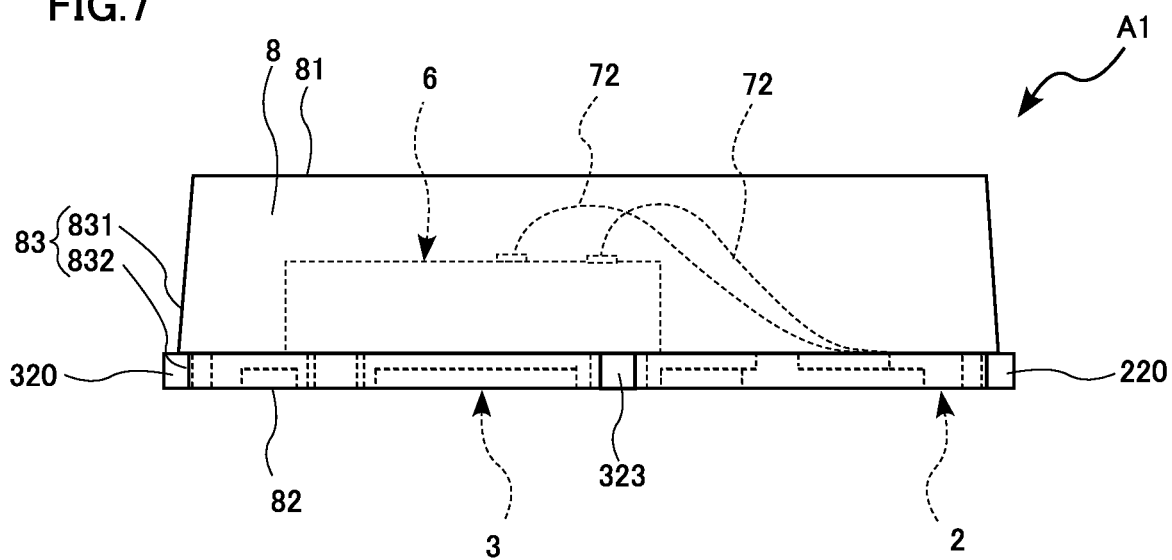
FIG. 7 is a left side view of the semiconductor device shown in FIG. 1.
Figure 8:
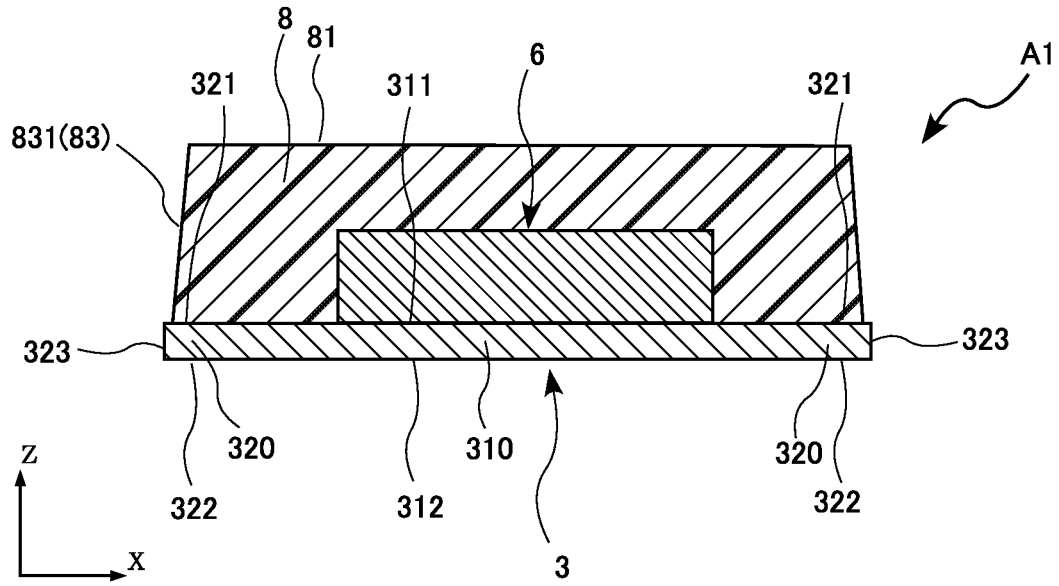
FIG. 8 is a sectional view taken along line VIII-VIII in FIG. 2.
Figure 9:
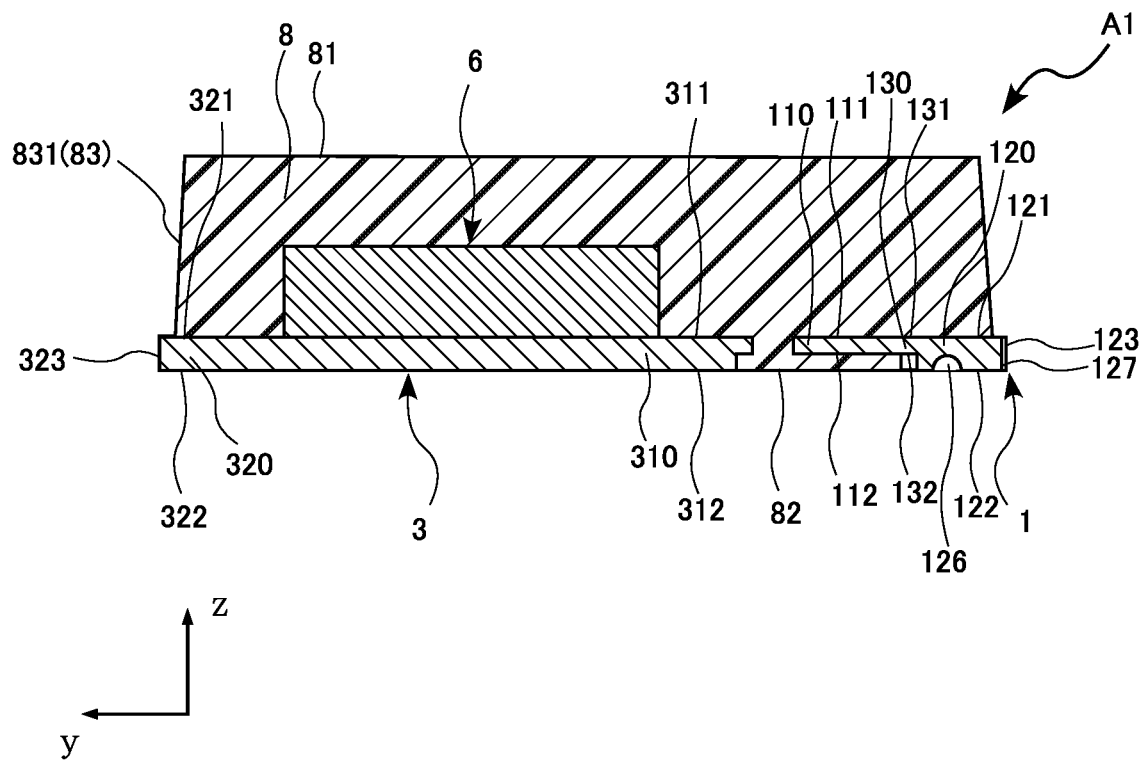
FIG. 9 is a sectional view taken along line IX-IX in FIG. 2.
Figure 10:
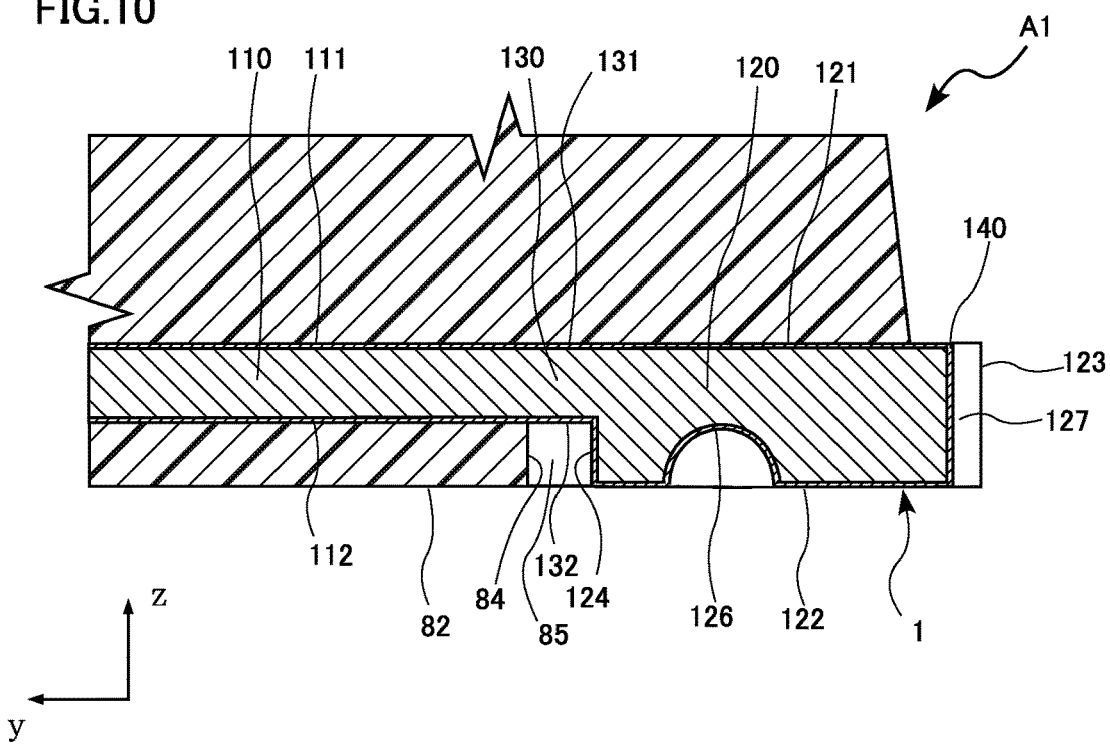
FIG. 10 is a sectional view showing a part of FIG. 9 as enlarged.
Figure 11:
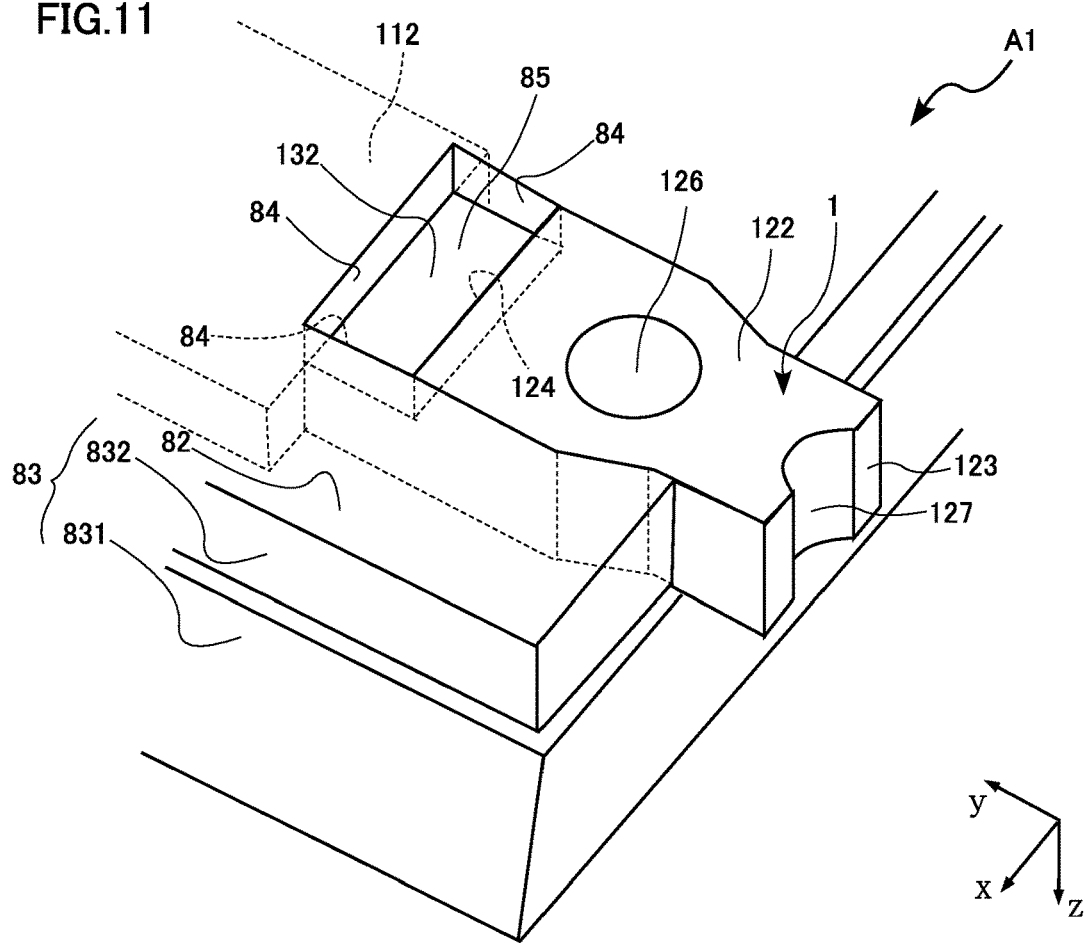
FIG. 11 is a perspective view of the semiconductor device shown in FIG. 1.

FIG. 1 is a perspective view of the semiconductor device A1. FIG. 2 is a plan view of the semiconductor device A1. In FIG. 2, for the convenience of understanding, the semiconductor device A1as seen through the sealing resin 8 is depicted, with the outline of the sealing resin 8 depicted by a two-dot chain line. FIG. 3 is a front view of the semiconductor device A1. FIG. 4 is a bottom view of the semiconductor device A1. FIG. 5 is a rear view of the semiconductor device A1. FIG. 6 is a right side view of the semiconductor device A1. FIG. 7 is a left side view of the semiconductor device A1. FIG. 8 is a sectional view taken along line VIII-VIII in FIG. 2. FIG. 9 is a sectional view taken along line IX-IX in FIG. 2. FIG. 10 is a sectional view showing a part of FIG. 9 as enlarged. FIG. 11 is a perspective view showing the semiconductor device A1, with its bottom side up.

The semiconductor device A1 is configured to be surface-mounted on circuit boards of various apparatuses. The semiconductor device A1 is rectangular as viewed in a thickness direction. For convenience of description, the thickness direction of the semiconductor device A1 is referred to as the z direction, the direction perpendicular to the z direction and along one side of the semiconductor device (i.e., horizontal direction in FIG. 2) is referred to as the x direction, and the direction perpendicular to both the z direction and the x direction (i.e., vertical direction in FIG. 2) is referred to as the y direction. The size of the semiconductor device A1 is not particularly limited. In the present embodiment, the dimension in the x direction is about 4 to 5 mm, the dimension in the y direction is about 5 to 6 mm, and the dimension in the z direction is about 0.5 to 1 mm.

The leads 1-3 support and/or are electrically connected to the semiconductor element 6. The leads 1-3 may be formed by punching or bending a metal plate. The leads 1-3 are made of a metal, preferably Cu or Ni, an alloy of these metals, or Alloy 42, for example. In the present embodiment, the case where the leads 1-3 are made of Cu is described as an example. The thickness of the leads 1-3 may be 0.08 to 0.3 mm, for example, and is about 0.25 mm in the present embodiment. Hereinafter, the leads 1, 2 and 3 are referred to as a first lead 1, a second lead 2 and a third lead 3, respectively, or collectively referred to as leads 1-3.

As shown in FIG. 2, the third lead 3 is arranged at a position offset toward one of the ends of the semiconductor device A1 in they direction (upper end in FIG. 2) and spreads substantially along the entire dimension of the semiconductor device A1 in the x direction. The first lead 1 and the second lead 2 are arranged on the other end (lower end in FIG. 2) of the semiconductor device A1 in the y direction and spaced apart from the third lead 3. The first lead 1 and the second lead 2 are arranged next to each other and spaced apart from each other in the x direction. As viewed in the z direction, the third lead 3 is the largest, and the first lead 1 is the smallest.

The third lead 3 includes a mount part 310, third-lead terminal parts 320 and a third-lead thin part 330.

The mount part 310 is located at the center of the third lead 3 and generally rectangular as viewed in the z direction. The mount part 310 has a mount-part front surface 311 and a mount-part back surface 312. The mount-part front surface 311 and the mount-part back surface 312 face opposite to each other in the z direction. The mount-part front surface 311 is the surface that faces upward in FIGS. 3 and 5 to 7. On the mount-part front surface 311, the semiconductor element 6 is mounted. The mount-part back surface 312 is the surface that faces downward in FIGS. 3 and 5-7. The mount-part back surface 312 is exposed from the sealing resin 8 to provide a back-surface terminal.

Each of the third-lead terminal parts 320 is connected to the mount part 310 and generally rectangular as viewed in the z direction. In the present embodiment, six third-lead terminal parts 320 are provided. Specifically, one of the third-lead terminal parts 320 is arranged on one of the end surfaces of the mount part 310 in the x direction and at a position offset toward one end in the y direction (downward in FIG. 2). Another one of the third-lead terminal parts 320 is arranged on the other end surface of the mount part 310 in the x direction and at a position offset toward the one end in the y direction. The remaining four third-lead terminal parts 320 are arranged at regular intervals on one of the end surfaces of the mount part 310 in the y direction (the upper end surface in FIG. 2). Each of the third-lead terminal parts 320 has a third-lead terminal-part front surface 321, a third-lead terminal-part back surface 322 and a third-lead terminal-part end surface 323. The third-lead terminal-part front surface 321 and the third-lead terminal-part back surface 322 face opposite to each other in the z direction. The third-lead terminal-part front surface 321 is the surface that faces upward in FIGS. 3 and 5-7. The third-lead terminal-part front surface 321 is flush with the mount-part front surface 311. The third-lead terminal-part back surface 322 is the surface that faces downward in FIGS. 3 and 5-7. The third-lead terminal-part back surface 322 is flush with the mount-part back surface 312. The third-lead terminal-part end surface 323 faces outward and connects the third-lead terminal-part front surface 321 and the third-lead terminal-part back surface 322 to each other. The third-lead terminal-part end surface 323 is on the outside of the sealing resin 8. The third-lead terminal-part back surface 322 and the third-lead terminal-part end surface 323 are exposed from the sealing resin 8 and connected to each other to provide a terminal (see FIGS. 8 and 9).

The third-lead thin part 330 is connected to the mount part 310 and arranged to surround the mount part 310 as viewed in the z direction. The thickness (i.e., the dimension in the z direction) of the third-lead thin part 330 is about a half of the thickness of the mount part 310. The third-lead thin part 330 is formed by half etching, for example. The third-lead thin part 330 has a third-lead thin-part front surface 331 and a third-lead thin-part back surface 332. The third-lead thin-part front surface 331 and the third-lead thin-part back surface 332 face opposite to each other in the z direction. The third-lead thin-part front surface 331 is the surface that faces upward in FIGS. 3 and 5-7. The third-lead thin-part front surface 331 is flush with the mount-part front surface 311. Thus, the mount-part front surface 311, the third-lead terminal-part front surfaces 321 and the third-lead thin-part front surface 331 are flush and integral with each other (see FIG. 2). The third-lead thin-part back surface 332 is the surface that faces downward in FIGS. 3 and 5-7.

All the surfaces of the third lead 3 except the third-lead terminal-part end surfaces 323 are formed with a plating layer (not shown). The plating layer may be a lamination of a Ni plating layer, a Pd plating layer and a Au plating layer, for example. In such a case, the Ni plating layer may be 0.5 µm to 2.0 µm in thickness, the Pd plating layer may be 0.02 µm to 0.15 µm in thickness, and the Au plating layer may be 0.003 µm to 0.015 µm in thickness. The configuration of the plating layer is not limited to this and may be a lamination of a Ni plating layer and a Au plating layer, for example. As will be described later, in the manufacturing process, a plating layer is formed on the entire surface of a lead frame. The third-lead terminal-part end surfaces 323 are the surfaces provided by cutting the lead frame, and hence, do not have a plating layer on them.

The first lead 1 is arranged at a corner (lower right corner in FIG. 2) of the semiconductor device A1 as viewed in the z direction and includes a wire bonding part 110, a first-lead terminal part 120 and a first-lead connecting part 130.

The wire bonding part 110 is rectangular as viewed in the z direction and located closer to the third lead 3 than other portions of the first lead 1 are. The wire bonding part 110 has a wire-bonding-part front surface 111 and a wire-bonding-part back surface 112. The wire-bonding-part front surface 111 and the wire-bonding-part back surface 112 face opposite to each other in the z direction. The wire-bonding-part front surface 111 is the surface that faces upward in FIGS. 3 and 5-7. The bonding wire 71 is bonded to the wire bonding-part-front surface 111. The wire-bonding-part back surface 112 is the surface that faces downward in FIGS. 3 and 5-7. The thickness (i.e., the dimension in the z direction) of the wire bonding part 110 is about a half of the thickness of the first-lead terminal part 120. The wire bonding part 110 is formed by half etching, for example.

The first-lead terminal part 120 is located on the opposite side of the third lead 3 with respect to the wire bonding part 110 and on the outer side in the y direction. The first-lead terminal part 120 has a first-lead terminal-part front surface 121, a first-lead terminal-part back surface 122, a first-lead terminal-part end surface 123 and a first-lead terminal-part second end surface 124. The first-lead terminal-part front surface 121 and the first-lead terminal-part back surface 122 face opposite to each other in the z direction. The first-lead terminal-part front surface 121 is the surface that faces upward in FIGS. 3 and 5-7. The first-lead terminal-part back surface 122 is the surface that faces downward in FIGS. 3 and 5-7. The first-lead terminal-part end surface 123 faces outward in the y direction and connects the first-lead terminal-part front surface 121 and the first-lead terminal-part back surface 122 to each other. The first-lead terminal-part end surface 123 is on the outside of the sealing resin 8. The first-lead terminal-part back surface 122 and the first-lead terminal-part end surface 123 are exposed from the sealing resin 8 and connected to each other to provide a terminal (see FIG. 9). The first-lead terminal-part second end surface 124 faces away from the first-lead terminal-part end surface 123, is exposed from the sealing resin 8 and is connected to the first-lead terminal-part back surface 122 (see FIGS. 10 and 11).

The first-lead connecting part 130 is connected to the wire bonding part 110 and the first-lead terminal part 120 to connect the wire bonding part 110 and the first-lead terminal part 120 to each other. The first-lead connecting part 130 is rectangular as viewed in the z direction. The thickness (i.e., the dimension in the z direction) of the first-lead connecting part 130 is about a half of the thickness of the first-lead terminal part 120 and the same as that of the wire bonding part 110. The first-lead connecting part 130 is formed by half etching, for example. The width (the dimension in the x direction) of the first-lead connecting part 130 is smaller than the width of the wire bonding part 110 and the same as the width of first-lead terminal part 120 at the end adjoining the first-lead connecting part 130. The first-lead connecting part 130 has a first-lead connecting-part front surface 131 and a first-lead connecting-part back surface 132. The first-lead connecting-part front surface 131 and the first-lead connecting-part back surface 132 face opposite to each other in the z direction. The first-lead connecting-part front surface 131 is the surface that faces upward in FIGS. 3 and 5-7. The first-lead connecting-part front surface 131, the wire-bonding-part front surface 111 and the first-lead terminal-part front surface 121 are flush and integral with each other (see FIGS. 2, 9 and 10). The first-lead connecting-part back surface 132 is the surface that faces downward in FIGS. 3 and 5-7. The first-lead connecting-part back surface 132 is flush with the wire-bonding-part back surface 112 and located closer to a resin front surface 81 than the first-lead terminal-part back surface 122 is (see FIGS. 10 and 11). The first-lead connecting-part back surface 132 is exposed from the sealing resin 8 and connected to the first-lead terminal-part second end surface 124 (see FIGS. 10 and 11). The first-lead connecting-part back surface 132 may not be entirely exposed from the sealing resin 8, and only a part of the first-lead connecting-part back surface 132 may be exposed from the sealing resin 8.

All the surfaces of the first lead 1 except the first-lead terminal-part end surface 123 are formed with a plating layer (see FIG. 10). The plating layer 140 is the same plating layer as that of the third lead 3 and may be a lamination of a Ni plating layer, a Pd plating layer and a Au plating layer, for example. The configuration of the plating layer is not limited to this. As will be described later, in the manufacturing process, a plating layer is formed on the entire surface of a lead frame. The first-lead terminal-part end surface 123 is the surface provided by cutting the lead frame, and hence, do not have the plating layer 140 on it.

As shown in FIGS. 4, 9, 10 and 11, the first lead 1 has a recess 126 in the first-lead terminal-part back surface 122. The recess 126 is circular as viewed in the z direction and located at or near the center of the first-lead terminal-part back surface 122. The outer edge of the recess 126 forms a closed shape within the first-lead terminal-part back surface 122. The recess 126 is formed by half etching or stamping, for example. The shape, number and arrangement of the recess 126 may be varied. The recess 126 is also formed with the plating layer 140 (see FIG. 10).

As shown in FIGS. 1, 2, 4, 9, 10 and 11, the first lead includes an end-surface recess 127 in the first-lead terminal-part end surface 123. The end-surface recess 127 extends from one end to the other end of the first-lead terminal-part end surface 123 in the z direction. As will be described later, the end-surface recess 127 is formed by making a through-hole in a lead frame followed by cutting the lead frame at the through-hole in the manufacturing process. The first-lead terminal-part end surface 123, which is the cut surface, is not formed with the plating layer 140, but the end-surface recess 127 is formed with the plating layer 140 (see FIG. 10).

The second lead 2 is arranged at a corner (lower left corner in FIG. 2) of the semiconductor device A1 as viewed in the z direction. The second lead 2 includes a wire bonding part 210, three second-lead terminal parts 220 and three second-lead connecting parts 230.

The wire bonding part 210 is in the form of a rectangle elongated in the x direction as viewed in the z direction and located closer to the third lead 3 than other portions of the second lead 2 are. The wire bonding part 210 has a wire-bonding-part front surface 211 and a wire-bonding-part back surface 212. The wire-bonding-part front surface 211 and the wire-bonding-part back surface 212 face opposite to each other in the z direction. The wire-bonding-part front surface 211 is the surface that faces upward in FIGS. 3 and 5-7. The bonding wires 72 are bonded to the wire bonding-part-front surface 211. The wire-bonding-part back surface 212 is the surface that faces downward in FIGS. 3 and 5-7. The thickness (i.e., the dimension in the z direction) of the wire bonding part 210 is about a half of the thickness of the second-lead terminal parts 220. The wire bonding part 210 is formed by half etching, for example.

The three second-lead terminal parts 220 are located on the opposite side of the third lead 3 with respect to the wire bonding part 210 and on the outer side in the y direction. The second-lead terminal parts 220 are arranged side by side at regular intervals in the x direction. Each of the second-lead terminal parts 220 has the same configuration as that of the first-lead terminal part 120. Specifically, each second-lead terminal part 220 has a second-lead terminal-part front surface 221, a second-lead terminal-part back surface 222, a second-lead terminal-part end surface 223 and a second-lead terminal-part second end surface 224. The second-lead terminal-part front surface 221 and the second-lead terminal-part back surface 222 face opposite to each other in the z direction. The second-lead terminal-part front surface 221 is the surface that faces upward in FIGS. 3 and 5-7. The second-lead terminal-part back surface 222 is the surface that faces downward in FIGS. 3 and 5-7. The second-lead terminal-part end surface 223 faces outward in the y direction and connects the second-lead terminal-part front surface 221 and the second-lead terminal-part back surface 222 to each other. The second-lead terminal-part end surface 223 is on the outside of the sealing resin 8. The second-lead terminal-part back surface 222 and the second-lead terminal-part end surface 223 are exposed from the sealing resin 8 and connected to each other to provide a terminal. The second-lead terminal-part second end surface 224 faces away from the second-lead terminal-part end surface 223, is exposed from the sealing resin 8 and is connected to the second-lead terminal-part back surface 222.

The second-lead connecting parts 230 connect the second-lead terminal parts 220 and the wire bonding part 210 to each other. Specifically, the three second-lead connecting parts 230, which are connected to the wire bonding part 210, are connected to the three second-lead terminal parts 220, respectively. Each of the second-lead connecting parts 230 is rectangular as viewed in the z direction. The thickness (i.e., the dimension in the z direction) of the second-lead connecting parts 230 is about a half of the thickness of the second-lead terminal parts 220 and the same as that of the wire bonding part 210. The second-lead connecting parts 230 are formed by half etching, for example. The width (i.e., the dimension in the x direction) of each second-lead connecting part 230 is the same as the width of each second-lead terminal part 220 at the end adjoining the second-lead connecting part 230. Each of the second-lead connecting parts 230 has a second-lead connecting-part front surface 231 and a second-lead connecting-part back surface 232. The second-lead connecting-part front surface 231 and the second-lead connecting-part back surface 232 face opposite to each other in the z direction. The second-lead connecting-part front surface 231 is the surface that faces upward in FIGS. 3 and 5-7. The second-lead connecting-part front surfaces 231, the wire-bonding-part front surface 211 and the second-lead terminal-part front surfaces 221 are flush and integral with each other (see FIG. 2). The second-lead connecting-part back surface 232 is the surface that faces downward in FIGS. 3 and 5-7. The second-lead connecting-part back surface 232 is flush with the wire-bonding-part back surface 212 and located closer to the resin front surface 81 than the second-lead terminal-part back surface 222 is. The second-lead connecting-part back surface 232 is exposed from the sealing resin 8 (see FIG. 4) and connected to the second-lead terminal-part second end surface 224. The second-lead connecting-part back surface 232 may not be entirely exposed from the sealing resin 8, and only a part of the second-lead connecting-part back surface 232 may be exposed from the sealing resin 8.

All the surfaces of the second lead 2 except the second-lead terminal-part end surfaces 223 are formed with a plating layer. The plating layer is the same as the plating layer 140 of the first lead 1 and may be a lamination of a Ni plating layer, a Pd plating layer and a Au plating layer, for example. The configuration of the plating layer is not limited to this. As will be described later, in the manufacturing process, a plating layer is formed on the entire surface of a lead frame. The second-lead terminal-part end surfaces 223 are the surfaces provided by cutting the lead frame, and hence, do not have a plating layer on them.

As shown in FIG. 4, the second lead 2 has a recess 226 in each of the second-lead terminal-part back surfaces 222. The recess 226 is circular as viewed in the z direction and located at or near the center of the second-lead terminal-part back surface 222. The outer edge of the recess 226 forms a closed shape within the second-lead terminal-part back surface 222. The recess 226 is formed by half etching or stamping, for example. The shape, number and arrangement of the recess 226 may be varied. The recess 226 is also formed with a plating layer.

As shown in FIGS. 1, 2 and 4, the second lead 2 also includes an end-surface recess 227 formed in the second-lead terminal-part end surface 223. The end-surface recess 227 extends from one end to the other end of the second-lead terminal-part end surface 223 in the z direction. As will be described later, the end-surface recess 227 is formed by making a through-hole in a lead frame followed by cutting the lead frame at the through-hole in the manufacturing process. The second-lead terminal-part end surface 223, which is the cut surface, is not formed with the plating layer, but the end-surface recess 227 is formed with the plating layer.

The semiconductor element 6 is an element that performs electrical functions of the semiconductor device A1. The type of the semiconductor element 6 is not particularly limited. In the present embodiment, the semiconductor element 6 is a transistor such as a MOSFET (metal-oxide-semiconductor field-effect transistor). The semiconductor element 6 includes an element body 60, a first electrode 61, a second electrode 62 and a third electrode 63 (see FIG. 5).

As shown in FIG. 2, for example, the first electrode 61 and the second electrode 62 are provided on a (first) surface of the element body 60 that faces away from the third lead 3. As shown in FIG. 5, the third electrode 63 is disposed on another (or second) surface of the element body 60 that faces the third lead 3. In the present embodiment, the first electrode 61 is a gate electrode, the second electrode 62 is a source electrode, and the third electrode 63 is a drain electrode. In the illustrated example, the third electrode 63 is formed on the entirety of the above-mentioned second surface of the element body 60, though the present disclosure is not limited to this configuration. For instance, the third electrode 63 may cover only a predetermined limited area of the above-mentioned second surface of the element body 60.

The semiconductor element 6 is mounted at the center of the mount-part front surface 311 of the third lead 3 using an electroconductive bonding material. Thus, the third electrode 63 of the semiconductor element 6 is electrically connected to the third lead 3 via the electroconductive bonding material. The bonding wire 71 is connected to the first electrode 61 of the semiconductor element 6 and the wire-bonding-part front surface 111 of the first lead 1. Thus, the first electrode 61 of the semiconductor element 6 is electrically connected to the first lead 1. The bonding wires 72 are connected to the second electrode 62 of the semiconductor element 6 and the wire-bonding-part front surface 211 of the second lead 2. Thus, the second electrode 62 of the semiconductor element 6 is electrically connected to the second lead 2.

The configuration of the semiconductor element 6 and the method for connecting the semiconductor element 6 to the leads 1-3 described above are merely an example. The type, number and arrangement of the semiconductor element 6 as well as the connection method may be varied.

The sealing resin 8 covers the semiconductor element 6, the bonding wires 71 and 72, and a part of each lead 1-3. The sealing resin 8 may be formed of a black epoxy resin.

The sealing resin 8 has a resin front surface 81, a resin back surface 82 and a resin side surface 83. The resin front surface 81 and the resin back surface 82 face opposite to each other in the z direction. The resin front surface 81 is the surface that faces upward in FIGS. 3 and 5-7. The resin back surface 82 is the surface that faces downward in FIGS. 3 and 5-7. The resin side surface 83 is the surface that connects the resin front surface 81 and the resin back surface 82 to each other and faces in the x direction or the y direction. The resin side surface 83 includes a first side surface 831 and a second side surface 832. The second side surface 832 is connected to the resin back surface 82 and parallel to the x-z plane or the y-z plane. The first side surface 831 is connected to the resin front surface 81 and inclined with respect to the x-z plane or the y-z plane.

In the present embodiment, the first-lead terminal part 120, the second-lead terminal parts 220 and the third-lead terminal parts 320 project from the second side surface 832 of the resin side surface 83. The first-lead terminal-part end surface 123 including the end-surface recess 127, the second-lead terminal-part end surfaces 223 including the end-surface recesses 227, and the third-lead terminal-part end surfaces 323 are exposed from the second side surface 832 of the resin side surface 83. The first-lead terminal-part back surface 122, the second-lead terminal-part back surfaces 222, the third-lead terminal-part back surfaces 322 and the mount-part back surface 312 of the third lead 3 are flush with the resin back surface 82 of the sealing resin 8. The recess 126 of the first-lead terminal part 120 and the recesses 226 of the second-lead terminal parts 220 are exposed from the resin back surface 82 of the sealing resin 8.

In forming the sealing resin in the manufacturing process, use is made of a mold that is configured such that the sealing resin will not cover the first-lead connecting-part back surface 132 and the first-lead terminal-part second end surface 124 as well as the second-lead connecting-part back surface 232 and the second-lead terminal-part second end surface 224. Thus, the resulting sealing resin 8 has interior side surfaces 84 that are perpendicular to the first-lead connecting-part back surface 132 and the second-lead connecting-part back surfaces 232 and that surround the first-lead connecting-part back surface 132 or the second-lead connecting-part back surfaces 232 (see FIGS. 10 and 11). The first-lead connecting-part back surface 132 and the first-lead terminal-part second end surface 124 as well as the second-lead connecting-part back surfaces 232 and the second-lead terminal-part second end surfaces 224 are exposed from the resin back surface 82 of the sealing resin. The first-lead connecting-part back surface 132, the first-lead terminal-part second end surface 124 and interior side surfaces 84 of the sealing resin 8 define a recess 85 (see FIGS. 10 and 11). Also, each of the second-lead connecting-part back surface 232, each of the second-lead terminal-part second end surfaces 224 and interior side surfaces 84 of the sealing resin 8 define a recess 85. The outer edge of each recess 85 forms a closed shape within the resin back surface 82.

A method for manufacturing the semiconductor device A1 is described below with reference to FIGS. 12 and 13.

Figure 12:
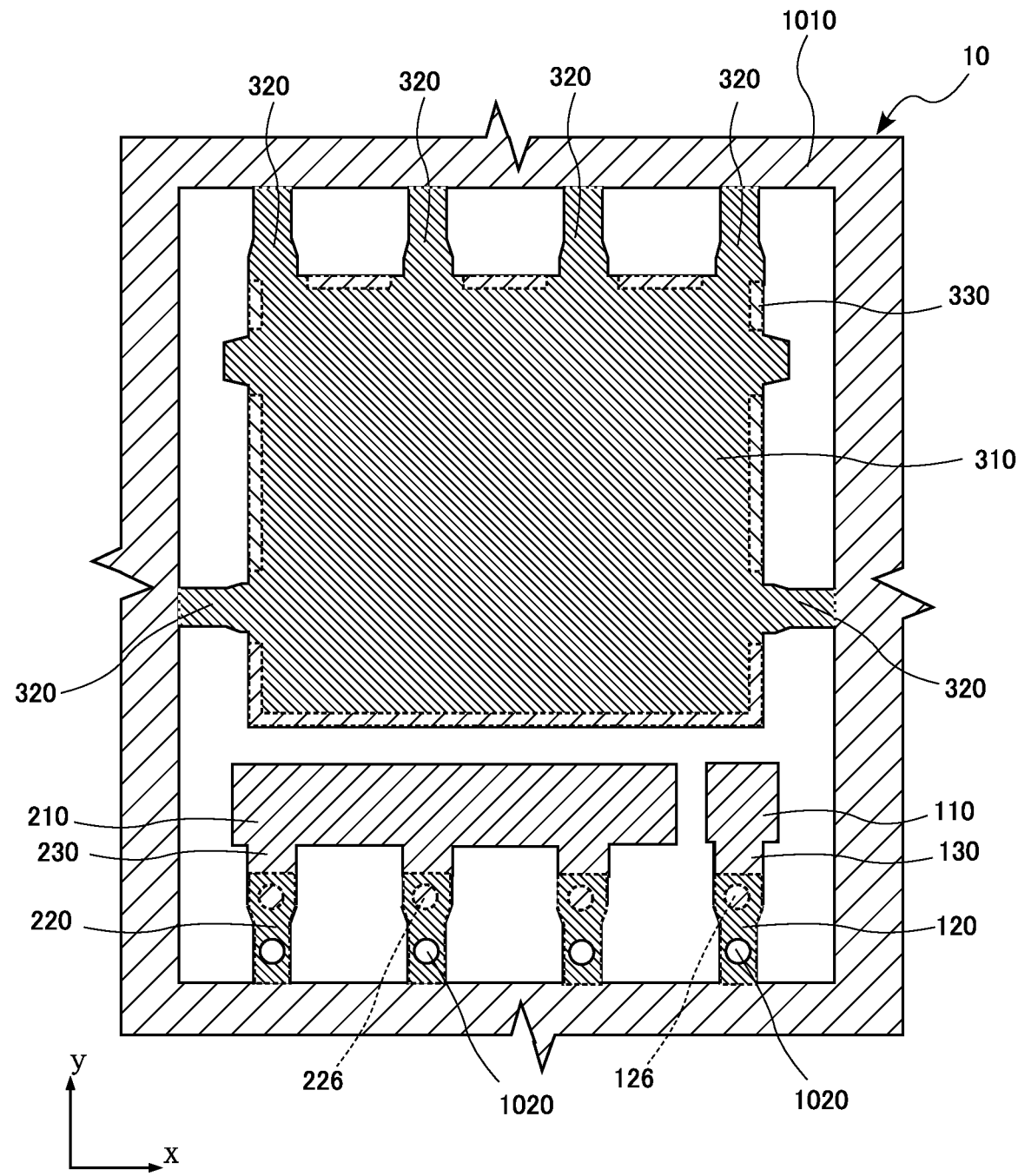
FIG. 12 is a plan view for describing a process for manufacturing the semiconductor device shown in FIG. 1.

First, a lead frame 10 is prepared, as shown in FIG. 12. The lead frame 10 is a plate-like material for providing the leads 1-3. The lead frame 10 has a front surface 1010 for providing the wire-bonding-part front surface 111, the first-lead terminal-part front surface 121, the first-lead connecting-part front surface 131, the wire-bonding-part front surface 211, the second-lead terminal-part front surfaces 221, the second-lead connecting-part front surfaces 231, the mount-part front surface 311, the third-lead terminal-part front surfaces 321 and the third-lead thin part 331. The front surface 1010 of the lead frame 10 is entirely flat. Indicated by relatively dense hatching in FIG. 12 is a region that has a larger thickness (dimension in the z direction) and provides the first-lead terminal part 120, the second-lead terminal parts 220, the mount part 310 and the third-lead terminal parts 320. Indicated by relatively coarse hatching in FIG. 12 is a region that has a smaller thickness (dimension in the z direction) and provides the wire bonding part 110, the first-lead connecting part 130, the recesses 126, the wire bonding part 210, the second-lead connecting parts 230, the recesses 226 and the third-lead thin part 330. This region is formed by half etching, for example. The recesses 126 and 226 may be formed by stamping. The lead frame 10 is also formed with through-holes 1020 to provide the end-surface recesses 127 and 227 at the regions that provide the first-lead terminal part 120 and the second-lead terminal parts 220. In the present embodiment, the base material for the lead frame 10 is Cu. The surfaces of the lead frame 10 are formed with a plating layer. The plating layer may be a lamination of a Ni plating layer, a Pd plating layer and a Au plating layer, for example. The plating layer is formed on the entire surface of the lead frame 10, including the inner walls of the through-holes 1020 and the inner surfaces of the recesses 126 and 226.

Figure 13:
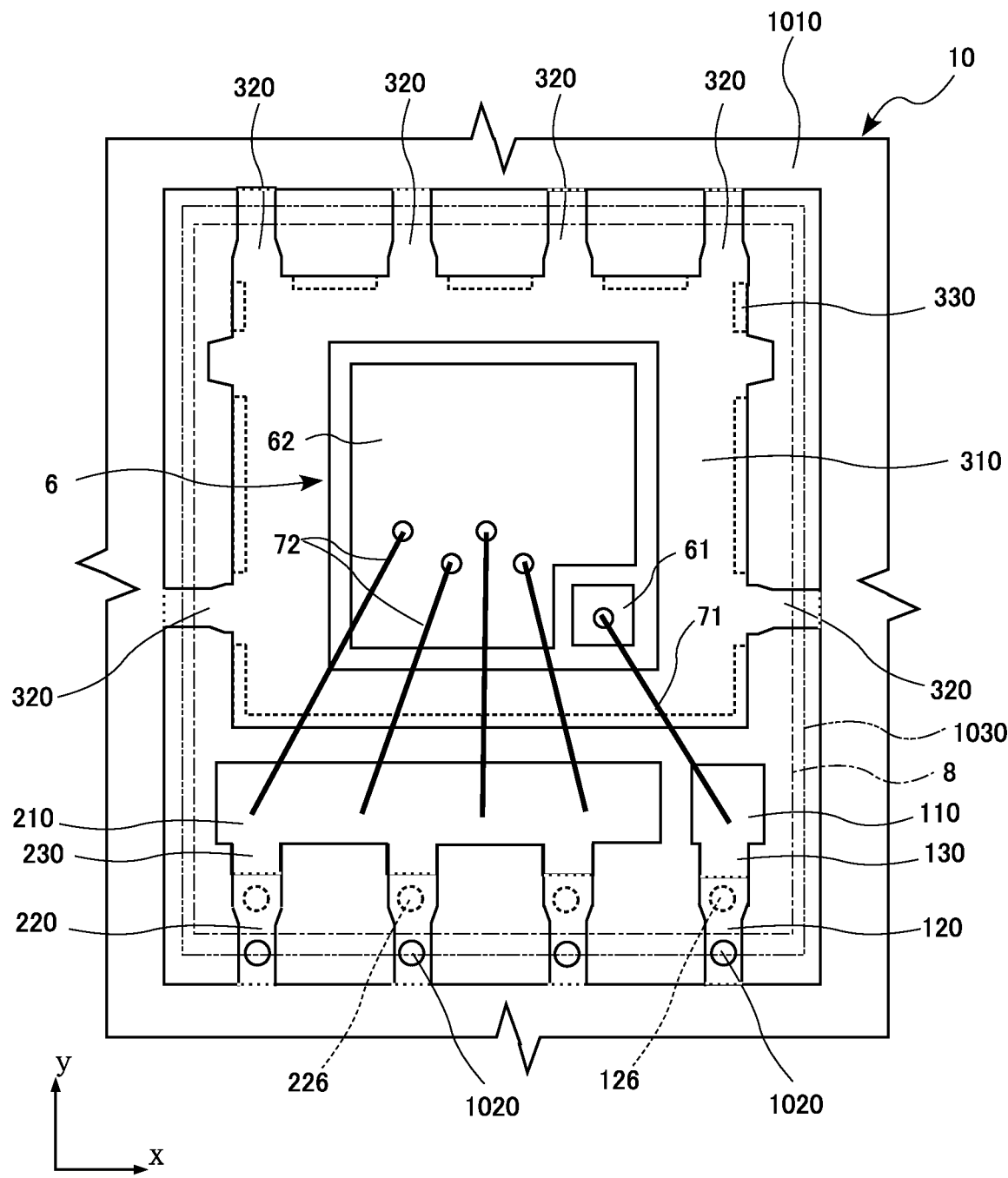
FIG. 13 is a plan view for describing the process for manufacturing the semiconductor device shown in FIG. 1.

Next, as shown in FIG. 13, the semiconductor element 6 is bonded to the mount part 310 of the lead frame 10 with an electroconductive bonding material. Then, a bonding wire 71 is bonded to the first electrode 61 of the semiconductor element 6 and the wire bonding part 110 of the first lead 1, while a plurality of bonding wires 72 are bonded to the second electrode 62 of the semiconductor element 6 and the wire bonding part 210 of the second lead 2.

Then, a resin material is cured to form the sealing resin 8 (indicated by single-dot chain line in FIG. 12) that covers a part of the lead frame 10, the semiconductor element 6 and the bonding wires 71 and 72. The lead frame 10 is then cut along the cut line 1030, which extends across the through-holes 1020. This cutting process provides the first-lead terminal-part end surface 123 and the second-lead terminal-part end surfaces 223, which are the cut surfaces, as well as the end-surface recesses 127 and 227 defined by portions of the inner walls of the through-holes 1020. Since the first-lead terminal-part end surface 123 and the second-lead terminal-part end surfaces 223 are cut surfaces provided by cutting, they are not formed with the plating layer 140. Meanwhile, the end-surface recess 127 and 227 are formed with the plating layer 140.

In this way, the semiconductor device A1 is obtained.

Figure 14:
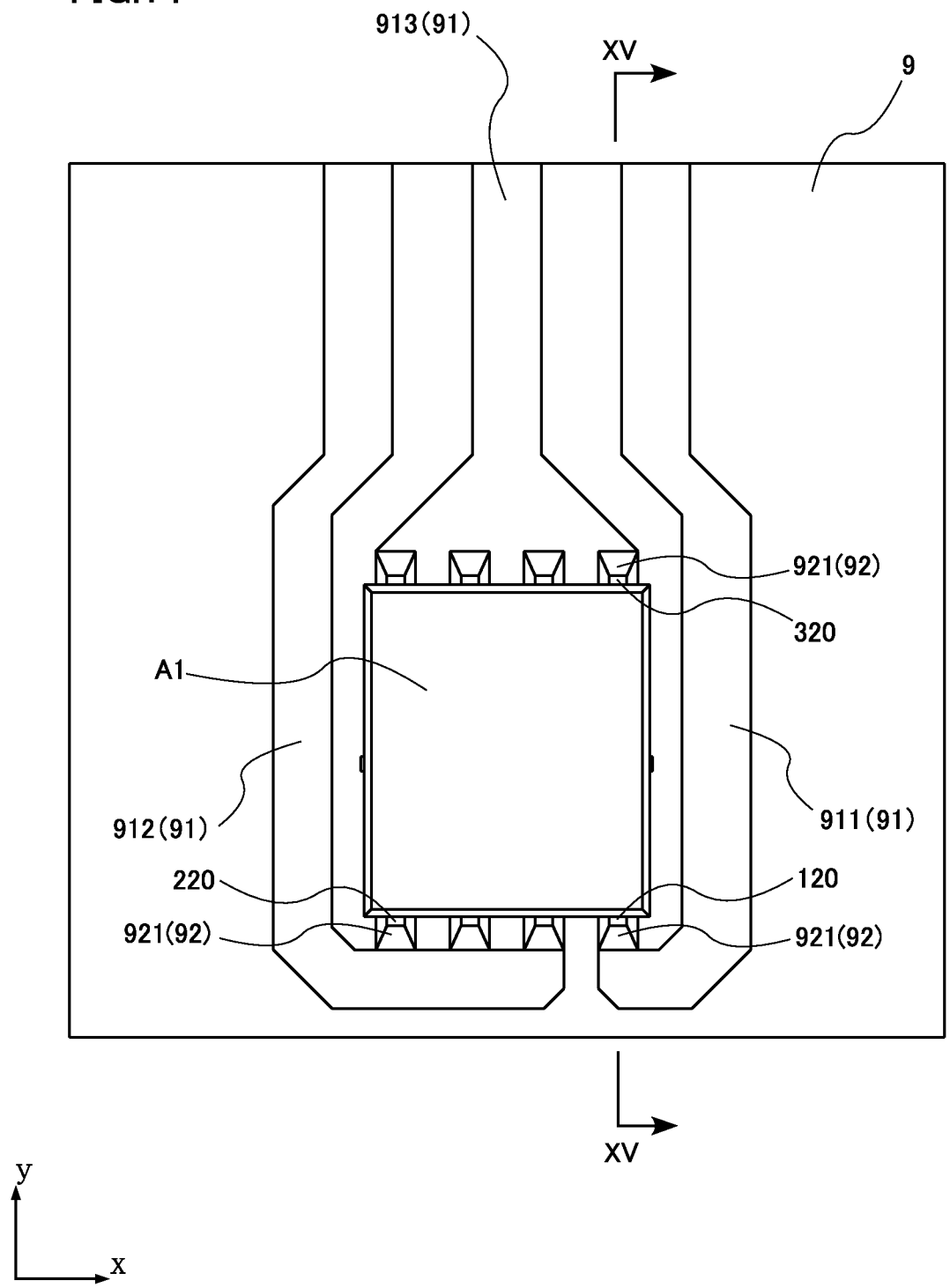
FIG. 14 is a plan view showing the semiconductor device of FIG. 1 as mounted on a circuit board.
Figure 15:
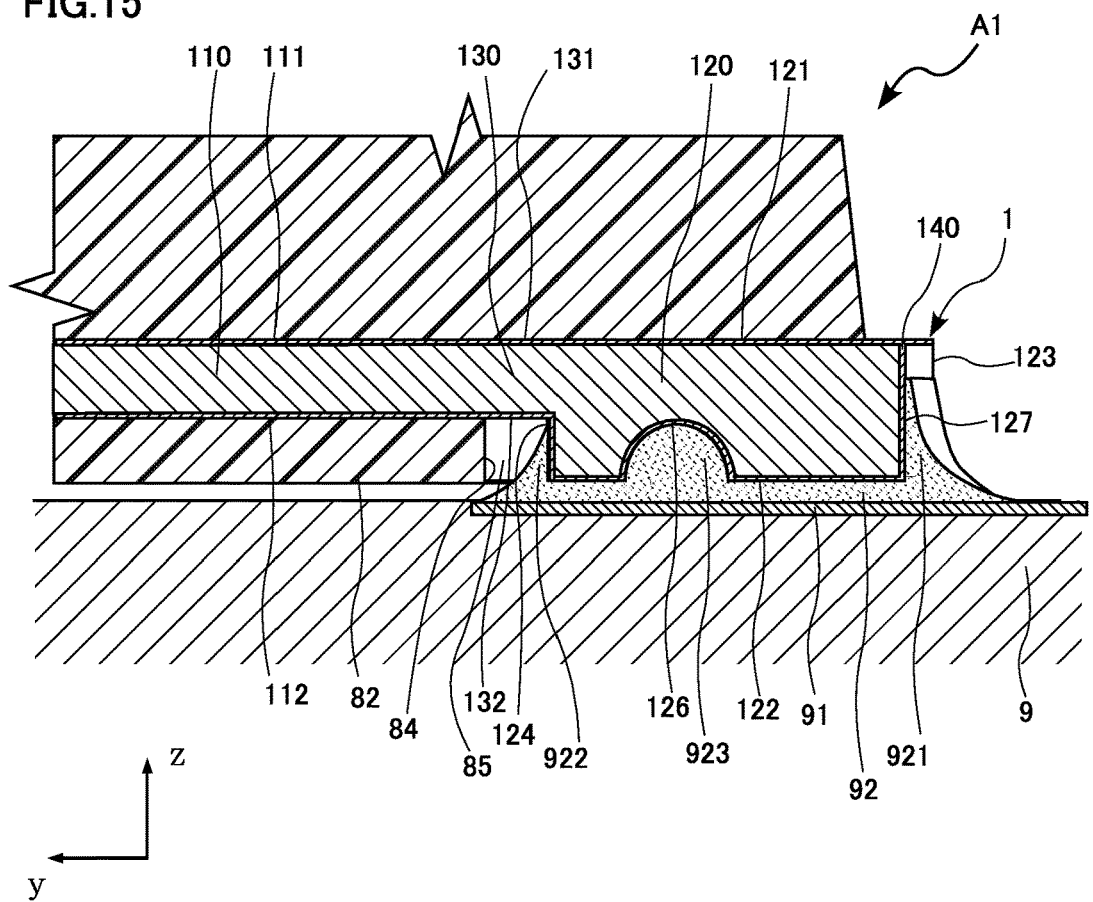
FIG. 15 is a schematic sectional view taken along lines XV-XV in FIG. 14.
Figure 16:
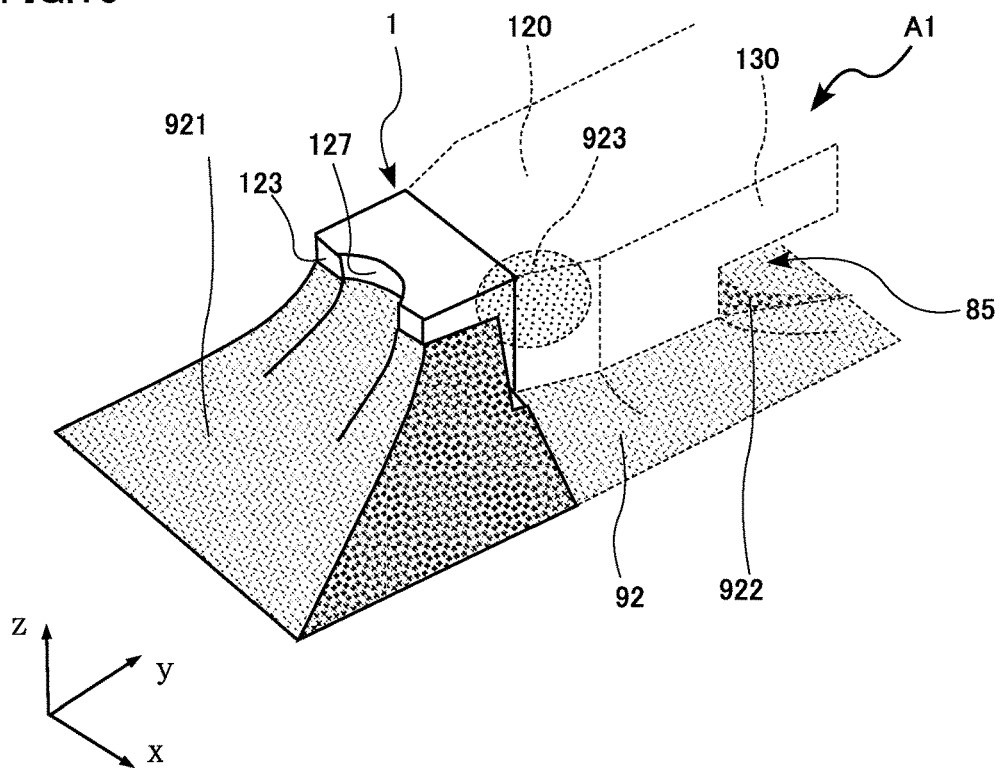
FIG. 16 is a perspective view showing a part of the semiconductor device of FIG. 1 as mounted on a circuit board.

Next, mounting of the semiconductor device A1 on a circuit board is described. FIGS. 14-16 are the views for describing mounting of the semiconductor device A1 on a circuit board 9. FIG. 14 is a plan view showing the semiconductor device A1 mounted on a circuit board 9. FIG. 15 is a schematic sectional view taken along lines XV-XV in FIG. 14. FIG. 16 is a perspective view showing the semiconductor device A1 mounted on the circuit board 9. Note that FIG. 16 shows the state as seen through the sealing resin 8, and the portions of the first lead 1 that are actually hidden by the sealing resin 8 are depicted by broken lines.

As shown in FIG. 14, the semiconductor device A1 is mounted on a circuit board 9, and the terminals of the semiconductor device A1 are bonded to a circuit wiring 91 formed on the circuit board 9 with solder 92. Specifically, the first-lead terminal part 120 is bonded to a circuit wiring 911, the three second-lead terminal parts 220 are bonded to a circuit wiring 912, and the third-lead terminal parts 320 are bonded to a circuit wiring 913. Note that, though not shown in FIG. 14, the mount-part back surface 312 of the third lead 3 is also bonded to the circuit wiring 913 with solder 92. In this way, solder 92 is provided between the circuit wiring 91 and the first-lead terminal part 120, the second-lead terminal parts 220 or the third-lead terminal parts 320.

FIGS. 15 and 16 show solder 92 formed between the first-lead terminal part 120 and the circuit wiring 91. Note that the solder 92 formed between each of the second-lead terminal parts 220 and the circuit wiring 91 have the same configuration as that shown in these figures. The solder 92 includes a first solder fillet 921, a second solder fillet 922 and a filling part 923. The first solder fillet 921 is formed on the outer side of the first-lead terminal part 120 in the y direction. Since the first-lead terminal-part end surface 123 is not formed with a plating layer 140, it has limited solder wettability. Thus, the first solder fillet 921 is mainly formed in the end-surface recess 127 formed with the plating layer 140.

The second solder fillet 922 is formed on the inner side of the first-lead terminal part 120 in the y direction. As described above, the recess 85 exists on the inner side of the first-lead terminal part 120 in the y direction. In the recess 85, the first-lead connecting-part back surface 132 and the first-lead terminal-part second end surface 124, which are formed with the plating layer 140, are exposed from the sealing resin 8. This allows the second solder fillet 922 to be formed in the recess 85 and mainly on the first-lead terminal-part second end surface 124. The filling part 923 is a portion of the solder 92 that fills the recess 126.

The advantages of the semiconductor device A1 are described below.

In the above embodiment, the first lead 1 has the recess 126 in the first-lead terminal-part back surface 122. In bonding the first-lead terminal part 120 to the circuit wiring 91 using the solder 92, the solder fills the recess 126, forming the filling part 923. Thus, the existence of the recess 126 increases the bond area between the first-lead terminal part 120 and the solder 92. This reduces formation of a crack in the solder 92 or separation of the solder 92 from the first-lead terminal-part back surface 122 due to thermal stress. Likewise, the second lead 2 has the recess 226 in each of the second-lead terminal-part back surfaces 222. This reduces formation of a crack in the solder 92 or separation of the solder 92 from the second-lead terminal-part back surface 222 due to thermal stress.

Also, in the above embodiment, the recess 85 is provided on the inner side of the first-lead terminal part 120 in the y direction. In bonding the first-lead terminal part 120 to the circuit wiring 91 using the solder 92, the solder fills the recess 85, forming the second solder fillet 922. This also contributes to reduction of formation of a crack in the solder or separation of the solder 92 from the first-lead terminal-part back surface 122 due to thermal stress. Likewise, the recess 85 is also provided on the inner side of each second-lead terminal part 220 in the y direction. This contributes to reduction of formation of a crack in the solder or separation of the solder 92 from the second-lead terminal-part back surface 222 due to thermal stress.

Moreover, in the above embodiment, the first lead 1 has the end-surface recess 127 in the first-lead terminal-part end surface 123. The end-surface recess 127, which is formed with the plating layer 140, allows a sufficiently large fillet (the first solder fillet 921) to be formed on the outer side of the first-lead terminal part 120 in the y direction, though the first-lead terminal-part end surface 123 is not formed with the plating layer 140. This also contributes to reduction of formation of a crack in the solder 92 or separation of the solder 92 from the first-lead terminal-part back surface 122 due to thermal stress. Likewise, the second lead 2 has the end-surface recess 227 in each of the second-lead terminal-part end surfaces 223. This also contributes to reduction of formation of a crack in the solder 92 or separation of the solder 92 from the second-lead terminal-part back surface 222 due to thermal stress.

Note that the first solder fillet 921 is formed on the first-lead terminal-part end surface 123 and the second-lead terminal-part end surfaces 223 even if these surfaces do not have the end-surface recesses 127 and 227. Thus, the end-surface recesses 127 and 227 are not necessarily required. However, to form a larger first solder fillet 921 on the outer side of the first-lead terminal part 120 and the second-lead terminal parts 220 in the y direction, it is desirable to form the end-surface recesses 127 and 227.

A surface plating layer may be formed on all the portions of each lead 1-3 that are exposed from the sealing resin 8. The surface plating layer is made of a material having higher solder wettability than that of the base material for the leads 1-3 and is made of Au, for example. The surface plating layer is formed by displacement electroless plating. When such a surface plating layer is formed on the first-lead terminal-part end surface 123 and/or the second-lead terminal-part end surfaces 223, solder easily adheres to the first-lead terminal-part end surface 123 and/or the second-lead terminal-part end surfaces 223, which allows for formation of larger first solder fillets 921. In this case, the end-surface recesses 127 and 227 need not be formed.

In the above embodiment, the case where the first lead 1 and/or the second lead 2 has both of the recess 126 or 226 and the recess 85 is described. However, the present disclosure is not limited to such a configuration. Each of the first lead 1 and the second lead 2 may have only one of the recess 126 (or 226) and the recess 85. Such a configuration also reduces separation of solder or formation of a crack in solder due to thermal stress, as compared with a conventional configuration.

In the above embodiment, the third-lead terminal parts 320 do not have any recesses that may correspond to the recess 126, the end-surface recess 127 and the recess 85 of the first-lead terminal part 120. This is because the third lead 3 is bonded to the circuit wiring 91 over a large area of the mount-part back surface 312 so that separation between the third-lead terminal-part back surface 322 and the solder 92, even if occurred, does not cause a significant problem. However, the third-lead terminal parts 320 may be formed with a recess corresponding to the recess 126, the end-surface recess 127 or the recess 85 of the first-lead terminal part 120.

In the above embodiment, the case where the first-lead terminal part 120, the second-lead terminal parts 220 and the third-lead terminal part 320 project from the sealing resin 8 is described, though the present disclosure is not limited thereto. The first-lead terminal-part end surface 123, the second-lead terminal-part end surfaces 223 and the third-lead terminal-part end surfaces 323 may be flush with the second side surface of the resin side surface 83 or may be retreated from the second side surface 832. Also, the shape of each end surface may be varied.

Figure 17:
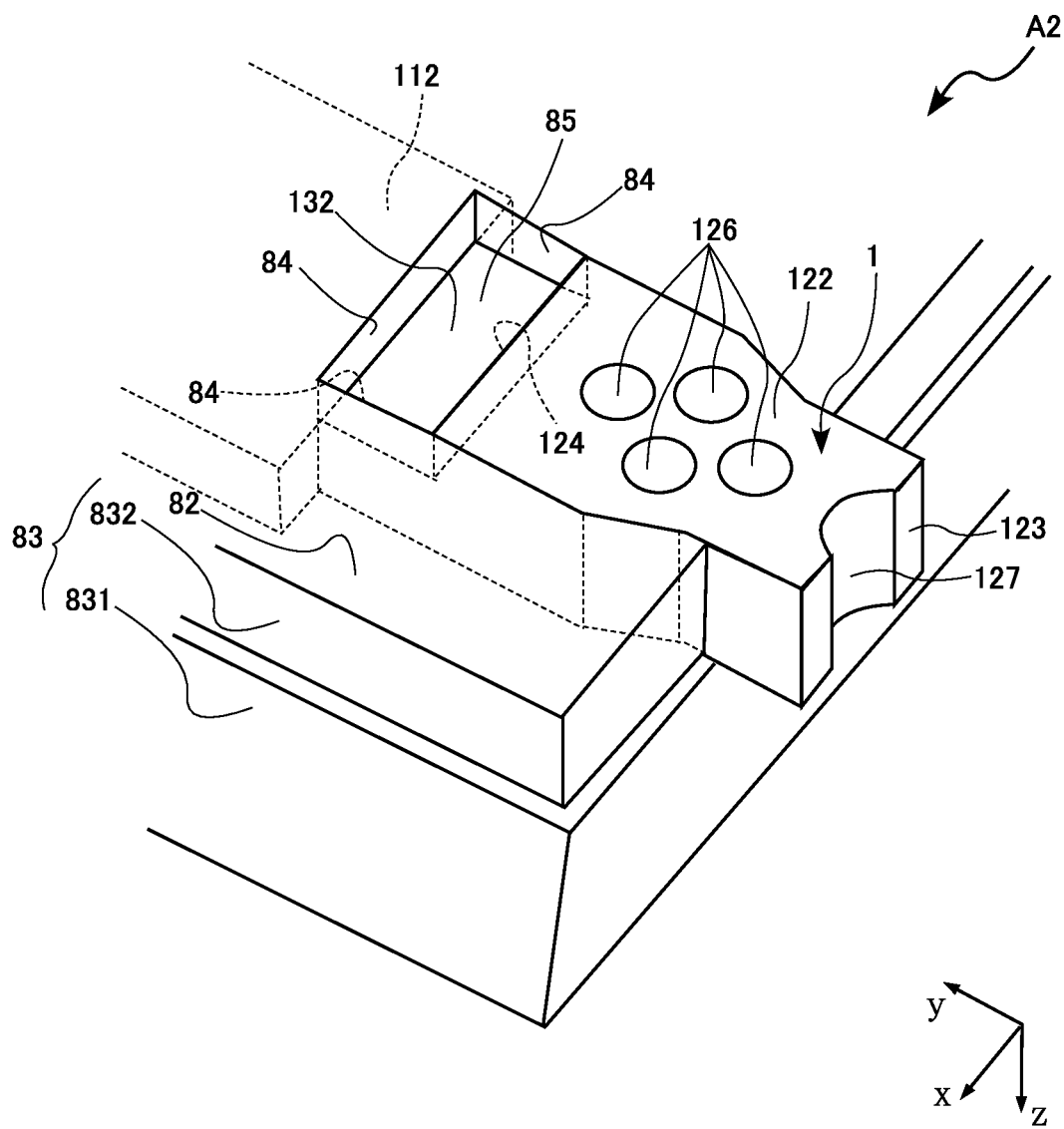
FIG. 17 is a perspective view showing a semiconductor device according to a second embodiment of the present disclosure.

A semiconductor device A2 according to a second embodiment of the present disclosure is described below with reference to FIG. 17. In FIG. 7, the elements that are identical or similar to those of the semiconductor device A1 are denoted by the same reference signs, and descriptions thereof are omitted. FIG. 17 is a perspective view of the semiconductor device A2, which corresponds to FIG. 11 that shows the semiconductor device A1 according to the first embodiment.

The semiconductor device A2 of the present embodiment differs from the semiconductor device A1 in number of recesses 126 formed in the first-lead terminal-part back surface 122. In the present embodiment, four recesses are formed in the first-lead terminal-part back surface 122. The outer edge of each recess 126 forms a closed shape within the first-lead terminal-part back surface 122.

In the present embodiment again, in bonding the first-lead terminal part 120 to the circuit wiring 91 using the solder 92, the solder fills each recess 126, forming the filling part 923. Thus, the existence of the recesses 126 increases the bond area between the first-lead terminal part 120 and the solder 92. This reduces formation of a crack in the solder 92 or separation of the solder 92 from the first-lead terminal-part back surface 122 due to thermal stress. Provision of a plurality of recesses 126 (four recesses 126 in the illustrated example) enhances the effect of reducing crack formation or separation of the solder 92.

The number of recesses 126 in the first-lead terminal-part back surface 122 is not limited and may be two, three, or more than four. The number of recesses 226 formed in each second-lead terminal-part back surface 222 may also be varied.

Figure 18:
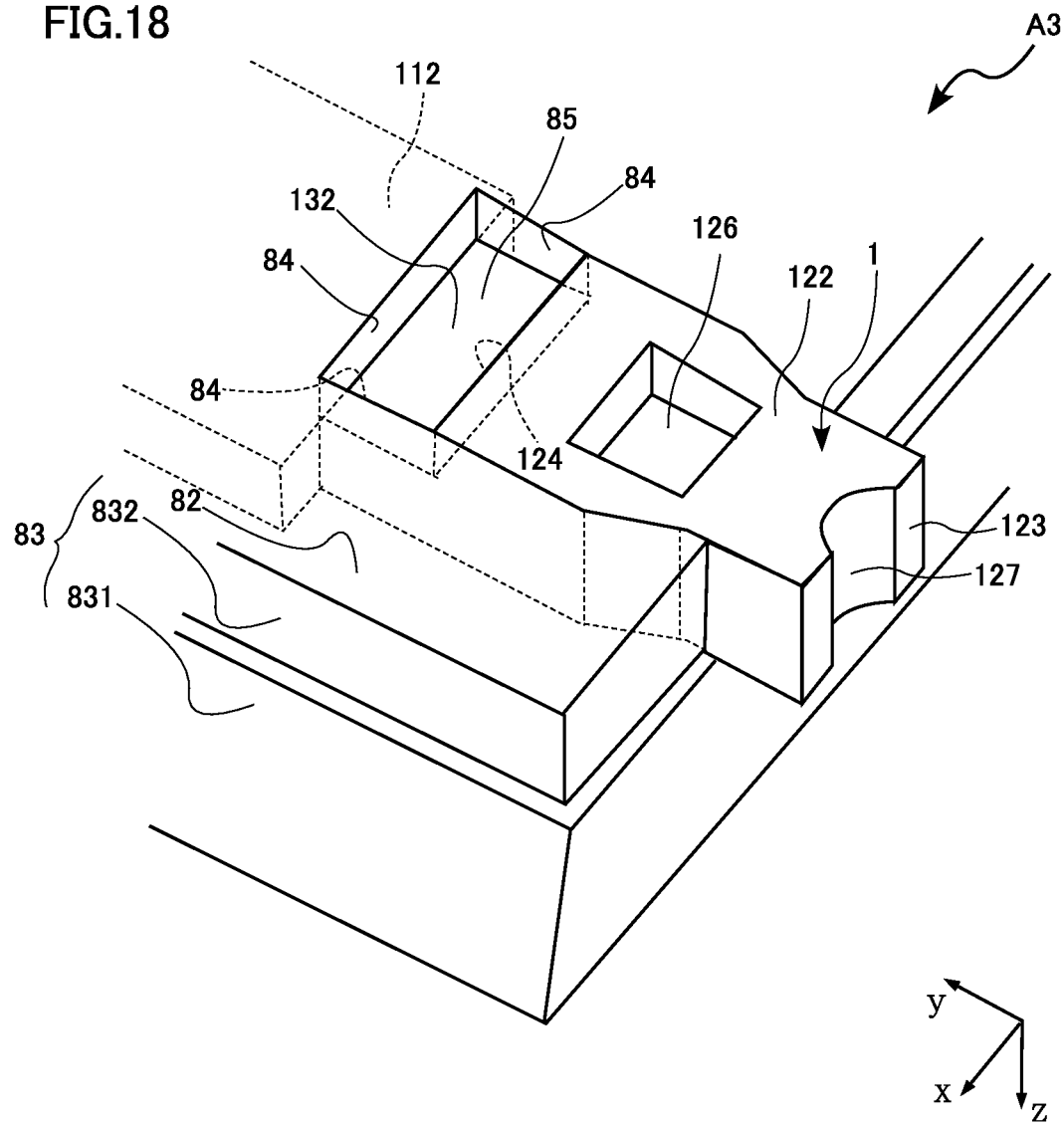
FIG. 18 is a perspective view showing a semiconductor device according to a third embodiment of the present disclosure.

A semiconductor device A3 according to a third embodiment of the present disclosure is described below with reference to FIG. 18. In FIG. 18, the elements that are identical or similar to those of the semiconductor device A1 are denoted by the same reference signs, and descriptions thereof are omitted. FIG. 18 is a perspective view of the semiconductor device A3, which corresponds to FIG. 11 that shows the semiconductor device A1 according to the first embodiment.

The semiconductor device A3 of the present embodiment differs from the semiconductor device A1 in shape of the recess 126. The recess 226 in the present embodiment is rectangular as viewed in the z direction and located at or near the center of the first-lead terminal-part back surface 122. The outer edge of the recess 126 forms a closed shape within the first-lead terminal-part back surface 122.

In the present embodiment again, in bonding the first-lead terminal part 120 to the circuit wiring 91 using the solder 92, the solder fills the recess 126, forming the filling part 923. Thus, the existence of the recess 126 increases the bond area between the first-lead terminal part 120 and the solder 92. This reduces formation of a crack in the solder 92 or separation of the solder 92 from the first-lead terminal-part back surface 122 due to thermal stress.

Note that the shape of the recess 126 is not limited to that in the illustrated example. The shape of the recess 226 in each of the second-lead terminal-part back surfaces 222 may also be varied.

Figure 19:
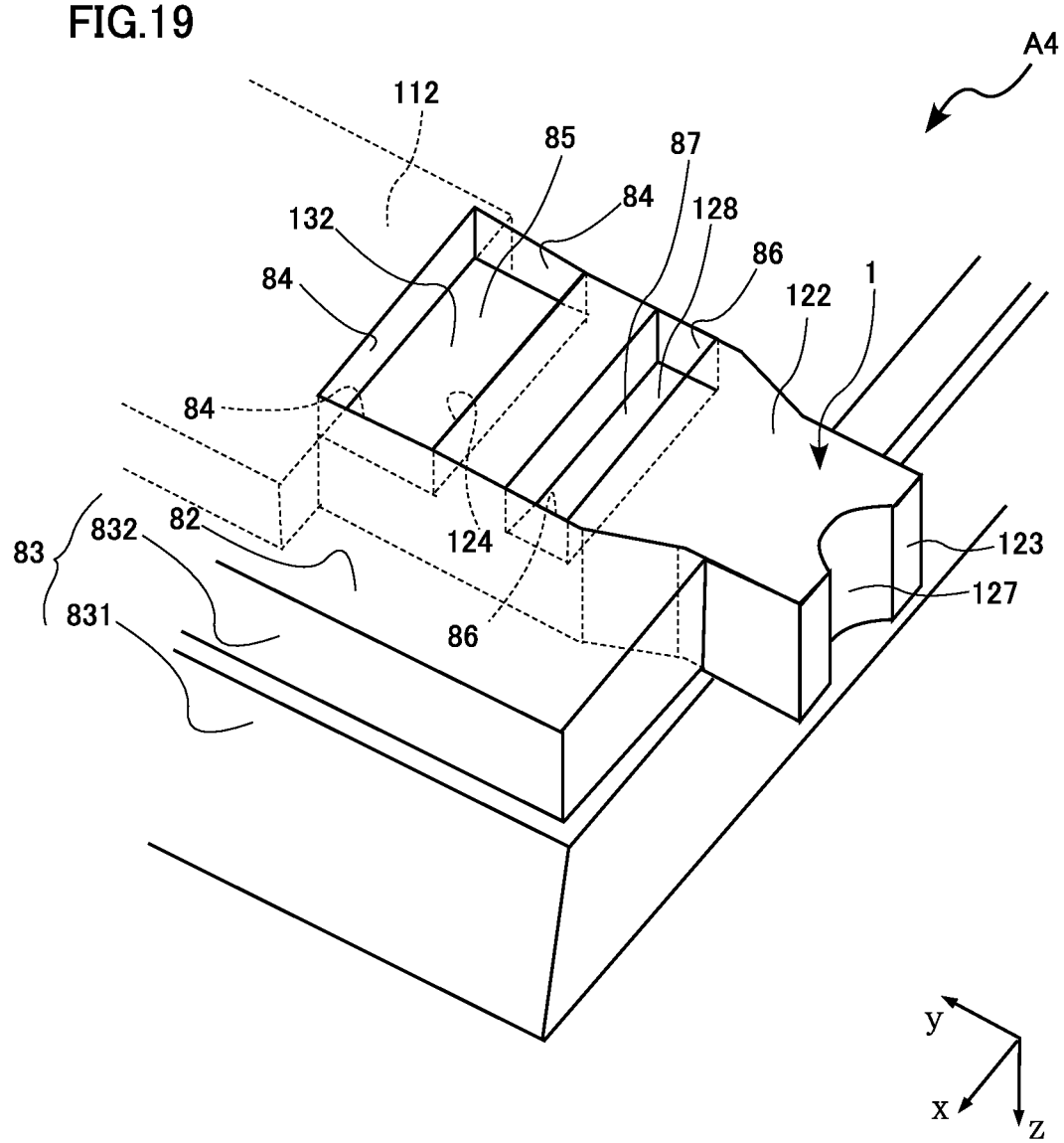
FIG. 19 is a perspective view showing a semiconductor device according to a fourth embodiment of the present disclosure.

A semiconductor device A4 according to a fourth embodiment of the present disclosure is described below with reference to FIG. 19. In FIG. 19, the elements that are identical or similar to those of the semiconductor device A1 are denoted by the same reference signs, and descriptions thereof are omitted. FIG. 19 is a perspective view of the semiconductor device A4, which corresponds to FIG. 11 that shows the semiconductor device A1 according to the first embodiment.

The semiconductor device A4 of the present embodiment has a recess 87, instead of the recess 126 of the semiconductor device A1. Specifically, instead of the recess 126, a groove 128 is formed in the first-lead terminal-part back surface 122. The groove 128 may extend in parallel to the first-lead terminal-part end surface 123 from one end to the other end of the first-lead terminal-part back surface 122 in the x direction. In forming the sealing resin in the manufacturing process, use is made of a mold that is configured such that the groove 128 is not covered with the sealing resin. Thus, the resulting sealing resin 8 has interior side surfaces 86 that are perpendicular to the groove 128. The inner surfaces of the groove 128 are exposed from the resin back surface 82 of the sealing resin 8. The recess 87 is defined by the groove 128 and the interior side surfaces 86. The outer edge of the recess 87 forms a closed shape within the resin back surface 82.

In the present embodiment again, in bonding the first-lead terminal part 120 to the circuit wiring 91 using the solder 92, the solder fills the recess 87, forming the filling part 923. Thus, the existence of the recess 87 increases the bond area between the first-lead terminal part 120 and the solder 92. This reduces formation of a crack in the solder 92 or separation of the solder 92 from the first-lead terminal-part back surface 122 due to thermal stress.

Note that a plurality of recesses 87 may be provided. The plurality of recesses can be formed by forming a plurality of grooves 128 in the first-lead terminal-part back surface 122. The recess 87 may be formed in the second-lead terminal-part back surfaces 222 as well.

Figure 20:
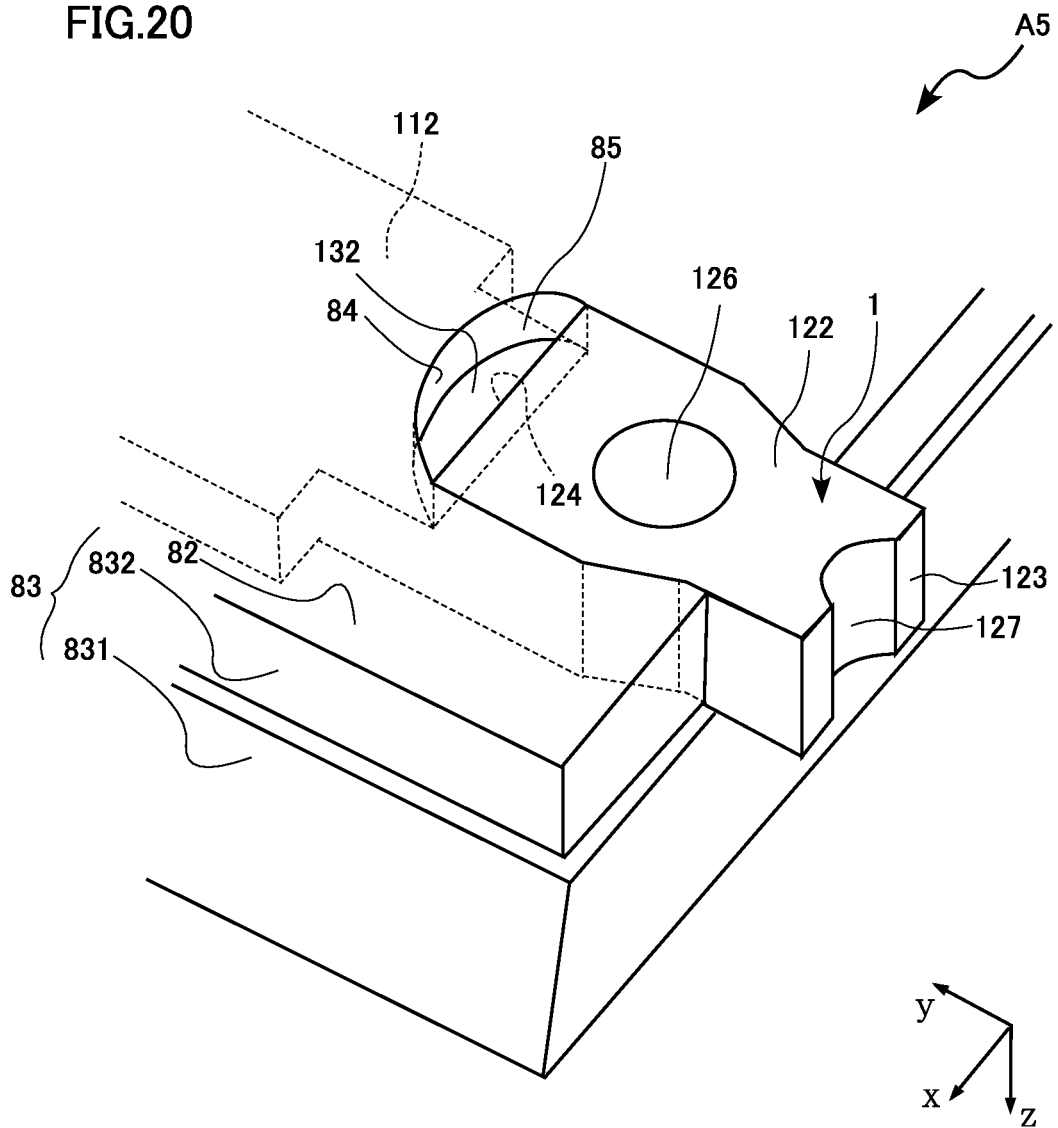
FIG. 20 is a perspective view showing a semiconductor device according to a fifth embodiment of the present disclosure.

A semiconductor device A5 according to a fifth embodiment of the present disclosure is described below with reference to FIG. 20. In FIG. 20, the elements that are identical or similar to those of the semiconductor device A1 are denoted by the same reference signs, and descriptions thereof are omitted. FIG. 20 is a perspective view of the semiconductor device A5, which corresponds to FIG. 11 that shows the semiconductor device A1 according to the first embodiment.

The semiconductor device A5 of the present embodiment differs from the semiconductor device A1 in shape of the recess 85. Specifically, the recess 85 of this embodiment is semicircular as viewed in the z direction and defined by the first-lead connecting-part back surface 132, the first-lead terminal-part second end surface 124, and the interior side surface 84 that is a curved surface. The outer edge of the recess 85 forms a closed shape within the resin back surface 82.

In the present embodiment again, in bonding the first-lead terminal part 120 to the circuit wiring 91 using the solder 92, the solder fills the recess 85, forming the second solder fillet 922. This reduces formation of a crack in the solder or separation of the solder 92 from the first-lead terminal-part back surface 122 due to thermal stress. Moreover, according to the present embodiment, the boundary between the resin back surface 82 and the interior side surfaces 84 is curved. Since the boundary has no pointed portion, chipping of the sealing resin 8 at the boundary is prevented.

Note that the shape of the recess 85 is not limited to that in the illustrated example. Additionally, the shape of the recess 85 on the inner side of each second-lead terminal part 220 in the y direction may also be varied.

Figure 21:
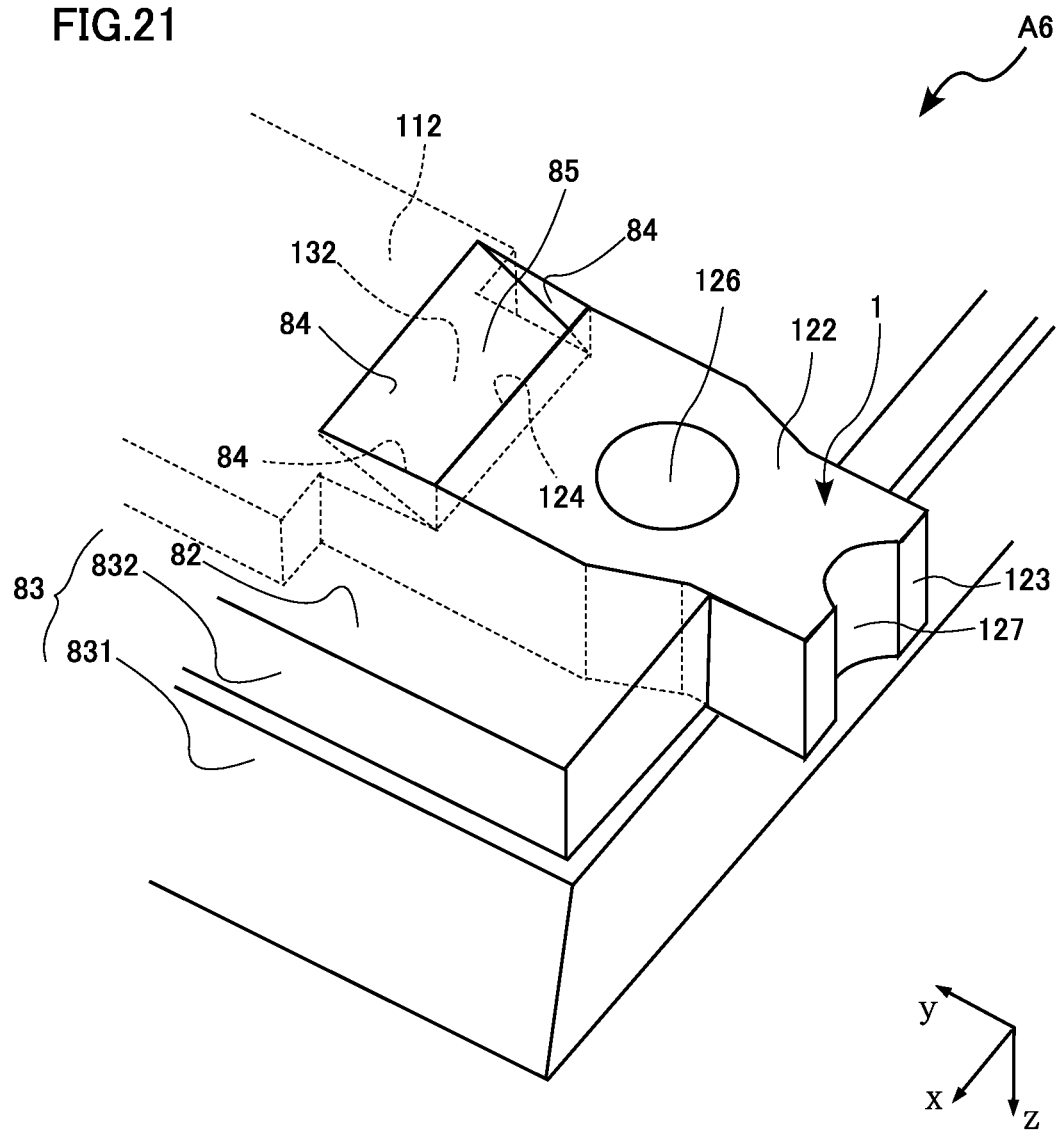
FIG. 21 is a perspective view showing a semiconductor device according to a sixth embodiment of the present disclosure.

A semiconductor device A6 according to a sixth embodiment of the present disclosure is described below with reference to FIG. 21. In FIG. 21, the elements that are identical or similar to those of the semiconductor device A1 are denoted by the same reference signs, and descriptions thereof are omitted. FIG. 21 is a perspective view of the semiconductor device A6, which corresponds to FIG. 11 that shows the semiconductor device A1 according to the first embodiment.

The semiconductor device A6 of the present embodiment differs from the semiconductor device A1 in shape of the recess 85. In the present embodiment, the first-lead connecting-part back surface 132 is not exposed from the resin back surface 82 but covered with the sealing resin 8. The recess 85 is defined by the first-lead terminal-part second end surface 124 and the interior side surfaces 84. The outer edge of the recess 85 forms a closed shape within the resin back surface 82.

In the present embodiment again, since the first-lead terminal-part second end surface 124 is exposed, the second solder fillet 922 is formed in the recess 85 in bonding the first-lead terminal part 120 to the circuit wiring 91 using the solder 92. This reduces formation of a crack in the solder or separation of the solder 92 from the first-lead terminal-part back surface 122 due to thermal stress.

Figure 22:
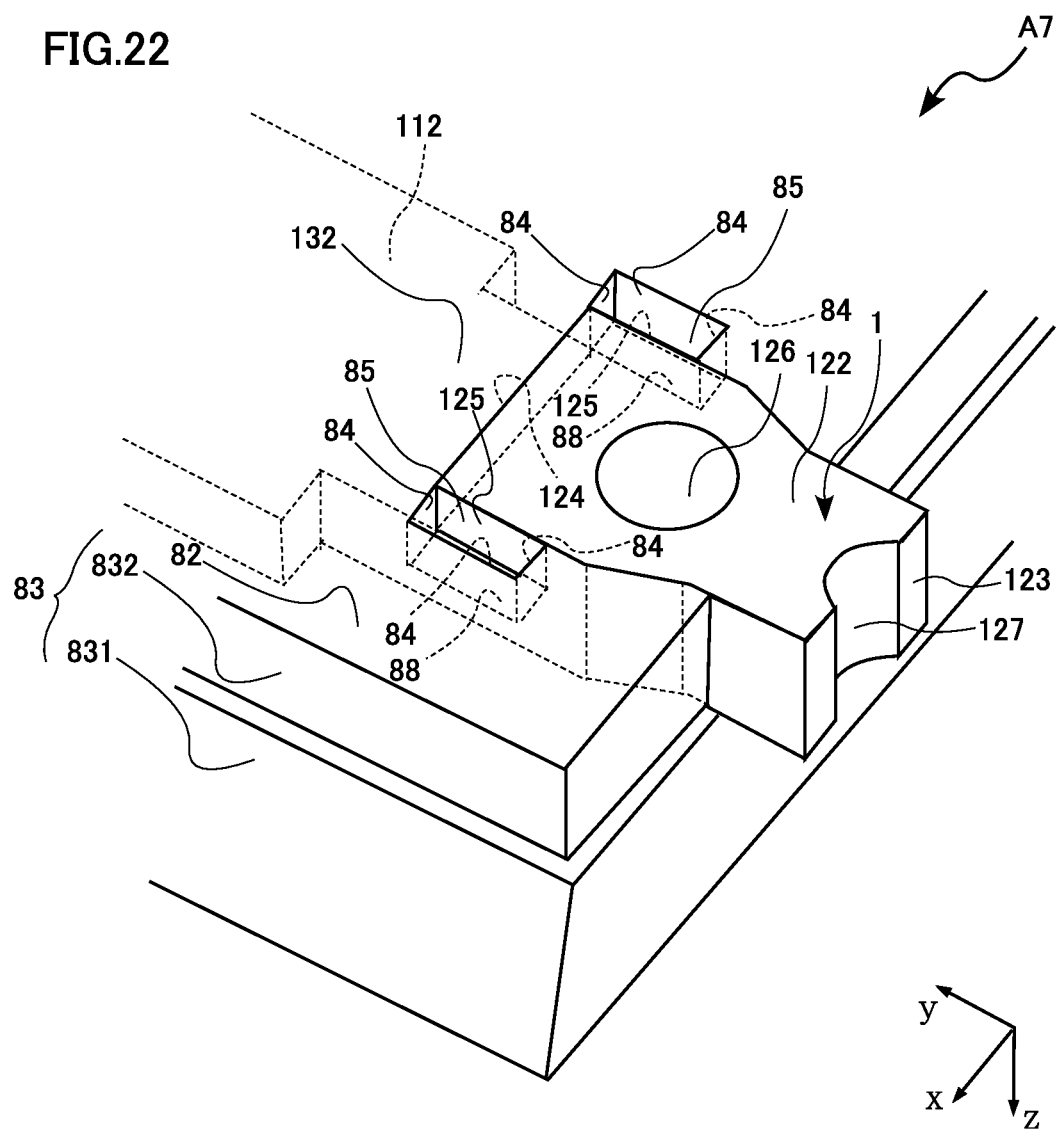
FIG. 22 is a perspective view showing a semiconductor device according to a seventh embodiment of the present disclosure.

A semiconductor device A7 according to a seventh embodiment of the present disclosure is described below with reference to FIG. 22. In FIG. 22, the elements that are identical or similar to those of the semiconductor device A1 are denoted by the same reference signs, and descriptions thereof are omitted. FIG. 22 is a perspective view of the semiconductor device A7, which corresponds to FIG. 11 that shows the semiconductor device A1 according to the first embodiment.

The semiconductor device A7 of the present embodiment differs from the semiconductor device A1 in configuration of the recess 85. In the present embodiment, the recess 85 is not arranged on the inner side of the first-lead terminal part 120 in they direction but arranged on each side of the first-lead terminal part 120 in the x direction. The first-lead terminal part 120 has a pair of first-lead terminal-part side surfaces 125. Each of the first-lead terminal-part side surfaces 125 faces in the x direction and connects the first-lead terminal-part front surface 121 and the first-lead terminal-part back surface 122 to each other. In forming the sealing resin in the manufacturing process, use is made of a mold that is configured such that a part of each first-lead terminal-part side surface 125 is not covered with the sealing resin. Thus, the resulting sealing resin 8 has interior side surfaces 84 that are perpendicular to the resin back surface 82 and interior back surfaces 88 that are parallel to the resin back surface 82. Each first-lead terminal-part side surface 125 is partially exposed from the resin back surface 82 of the sealing resin 8. The recesses 85 are defined by the first-lead terminal-part side surfaces 125, the interior side surfaces 84 of the sealing resin 8 and the interior back surfaces 88. The outer edge of each recess 85 forms a closed shape within the resin back surface 82.

In the present embodiment again, since each of the first-lead terminal-part side surfaces 125 is partially exposed, the second solder fillet 922 is formed in each recess 85 in bonding the first-lead terminal part 120 to the circuit wiring 91 using the solder 92. This reduces formation of a crack in the solder 92 or separation of the solder 92 from the first-lead terminal-part back surface 122 due to thermal stress. The configuration of the present embodiment is particularly effective in reducing formation of a crack due to thermal stress in the x direction.

Note that the recess 85 may not be provided on each side but may be provided on only one side of the first-lead terminal part 120 in the x direction. Moreover, the recess 85 according to the first embodiment, which is provided on the outer side of the first-lead terminal part 120 in the y direction, may be additionally provided. The recesses 85 according to the seventh embodiment and the recess 85 according to the first embodiment may be connected to each other to provide a recess that surrounds the outer side in the y direction and each side in the x direction of the first-lead terminal part 120.

Figure 23:
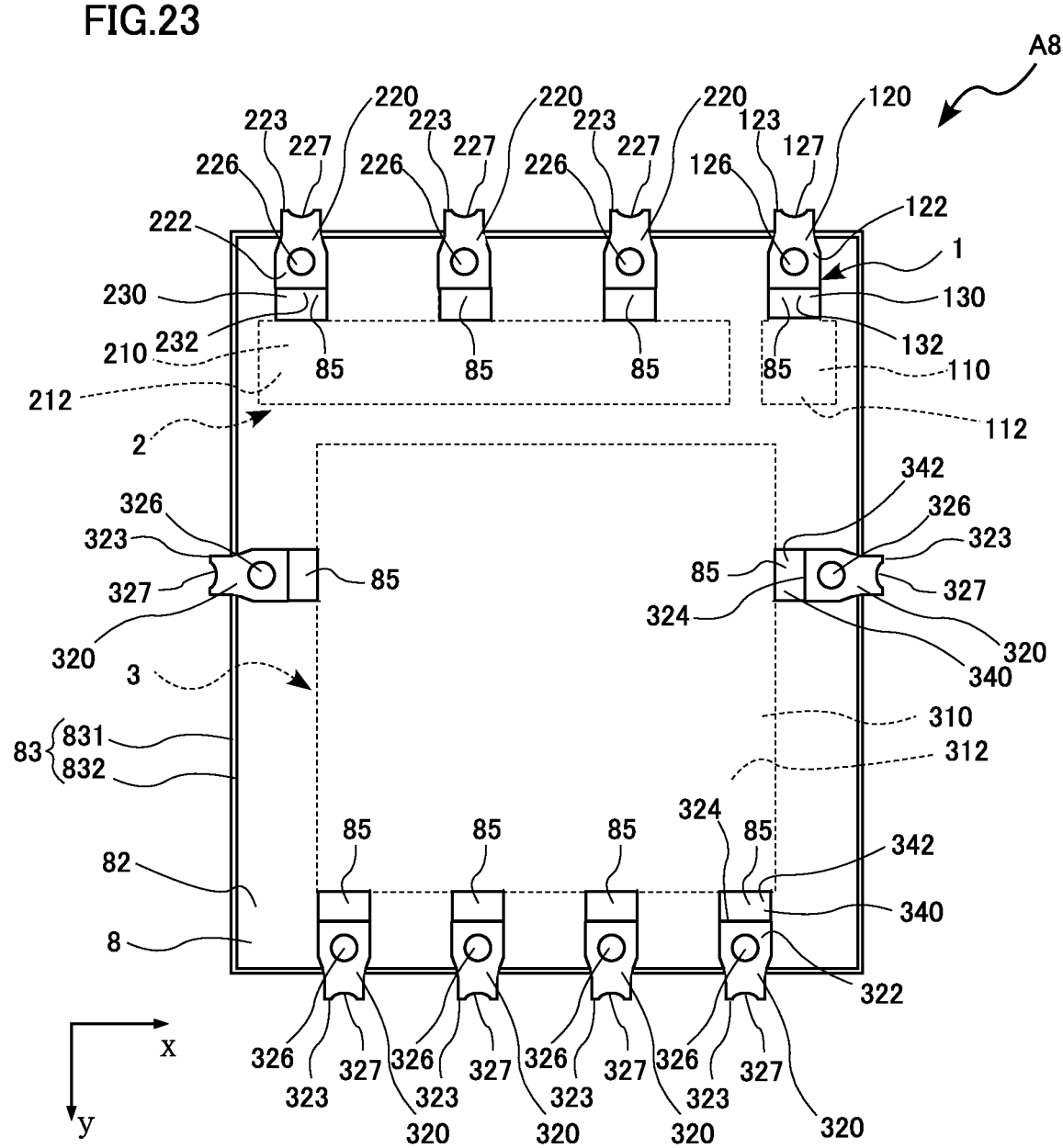
FIG. 23 is a bottom view showing a semiconductor device according to an eighth embodiment of the present disclosure.

A semiconductor device A8 according to an eighth embodiment of the present disclosure is described below with reference to FIG. 23. In FIG. 23, the elements that are identical or similar to those of the semiconductor device A1 are denoted by the same reference signs, and descriptions thereof are omitted. FIG. 23 is a bottom view of the semiconductor device A8, which corresponds to FIG. 4 that shows the semiconductor device A1 according to the first embodiment.

The semiconductor device A8 of the present embodiment differs from the semiconductor device A1 in configuration of the third lead 3. In the present embodiment, the dimension of the mount part 310 of the third lead 3 in the z direction is about a half of that of the third-lead terminal parts 320. The mount-part back surface 312 is not exposed from the resin back surface 82 of the sealing resin 8 and hence does not provide a back-surface terminal. The third lead 3 does not include a third-lead thin part 330. In other words, the entirety of the mount part 310 provides a third-lead thin part 330.

Each of the third-lead terminal parts 320 has the same configuration as that of the first-lead terminal part 120. That is, each third-lead terminal part 320 further includes a third-lead terminal-part second end surface 324, a recess 326 and an end-surface recess 327. The third-lead terminal-part second end surface 324 faces away from the third-lead terminal-part end surface 323, is exposed from the sealing resin 8 and is connected to the third-lead terminal-part back surface 322. The recess 326 has the same configuration as that of the recess 126. That is, the recess 326 is formed in the third-lead terminal-part back surface 322 and circular as viewed in the z direction. The end-surface recess 327 has the same configuration as that of the end-surface recess 127. That is, the end-surface recess 327 is formed in the third-lead terminal-part end surface 323 and extends from one end to the other end of the third-lead terminal-part end surface 323 in the z direction.

The third lead 3 further includes third-lead connecting parts 340 that connect the mount part 310 and the third-lead terminal parts 320 to each other. Each of the third-lead connecting parts 340 is connected to the mount part 310 and a respective one of the third-lead terminal parts 320. Each third-lead connecting part 340 is rectangular as viewed in the z direction. The thickness (i.e., the dimension in the z direction) of the third-lead connecting part 340 is about a half of the thickness of the third-lead terminal part 320 and the same as that of the mount part 310. The third-lead connecting part 340 is formed by half etching, for example. The third-lead connecting part 340 has a third-lead connecting-part front surface 341 and a third-lead connecting-part back surface 342. The third-lead connecting-part front surface 341 and the third-lead connecting-part back surface 342 face opposite to each other in the z direction. The third-lead connecting-part front surface 341 is located on the back side of the sheet surface of FIG. 23 in the z direction and is not shown in FIG. 23. The third-lead connecting-part front surfaces 341, the mount-part front surface 311 and the third-lead terminal-part front surfaces 321 are flush and integral with each other. The third-lead connecting-part back surface 342 is located on the sheet surface side of FIG. 23 in the z direction. The third-lead connecting-part back surface 342 is flush with the mount-part back surface 312 and located closer to the resin front surface 81 than the third-lead terminal-part back surface 322 is. The third-lead connecting-part back surface 342 is exposed from the resin back surface 82 of the sealing resin 8 and connected to the third-lead terminal-part second end surface 324. The third-lead connecting-part back surface 342 may not be entirely exposed from the sealing resin 8, and only a part of the third-lead connecting-part back surface 342 may be exposed from the sealing resin 8.

In forming the sealing resin in the manufacturing process, use is made of a mold that is configured such that the third-lead connecting-part back surface 342 and the third-lead terminal-part second end surface 324 are not covered with the sealing resin. Thus, the resulting sealing resin 8 has interior side surfaces 84 that are perpendicular to the third-lead connecting-part back surface 342 and that surround the third-lead connecting-part back surface 342. The third-lead connecting-part back surface 342 and the third-lead terminal-part second end surface 324 are exposed from the resin back surface 82 of the sealing resin 8. Thus, on the inner side of each third-lead terminal part 320, a recess 85 is defined by the third-lead connecting-part back surface 342, the third-lead terminal-part second end surface 324 and the interior side surfaces 84 of the sealing resin 8.

According to the present embodiment, since the third lead 3 has recesses 326 formed in the third-lead terminal-part back surfaces 322, formation of a crack in the solder 92 or separation of the solder 92 from the third-lead terminal-part back surfaces 322 due to thermal stress is reduced. Further, recesses 85 are formed on the inner side of the third-lead terminal parts 320. This contributes to reduction of formation of a crack in the solder 92 or separation of the solder 92 from the third-lead terminal-part back surfaces 322 due to thermal stress. Moreover, the third lead 3 has end-surface recesses 327 formed in the third-lead terminal-part end surfaces 323. This also contributes to reduction of formation of a crack in the solder or separation of the solder 92 from the third-lead terminal-part back surfaces 322 due to thermal stress.

Figure 24:
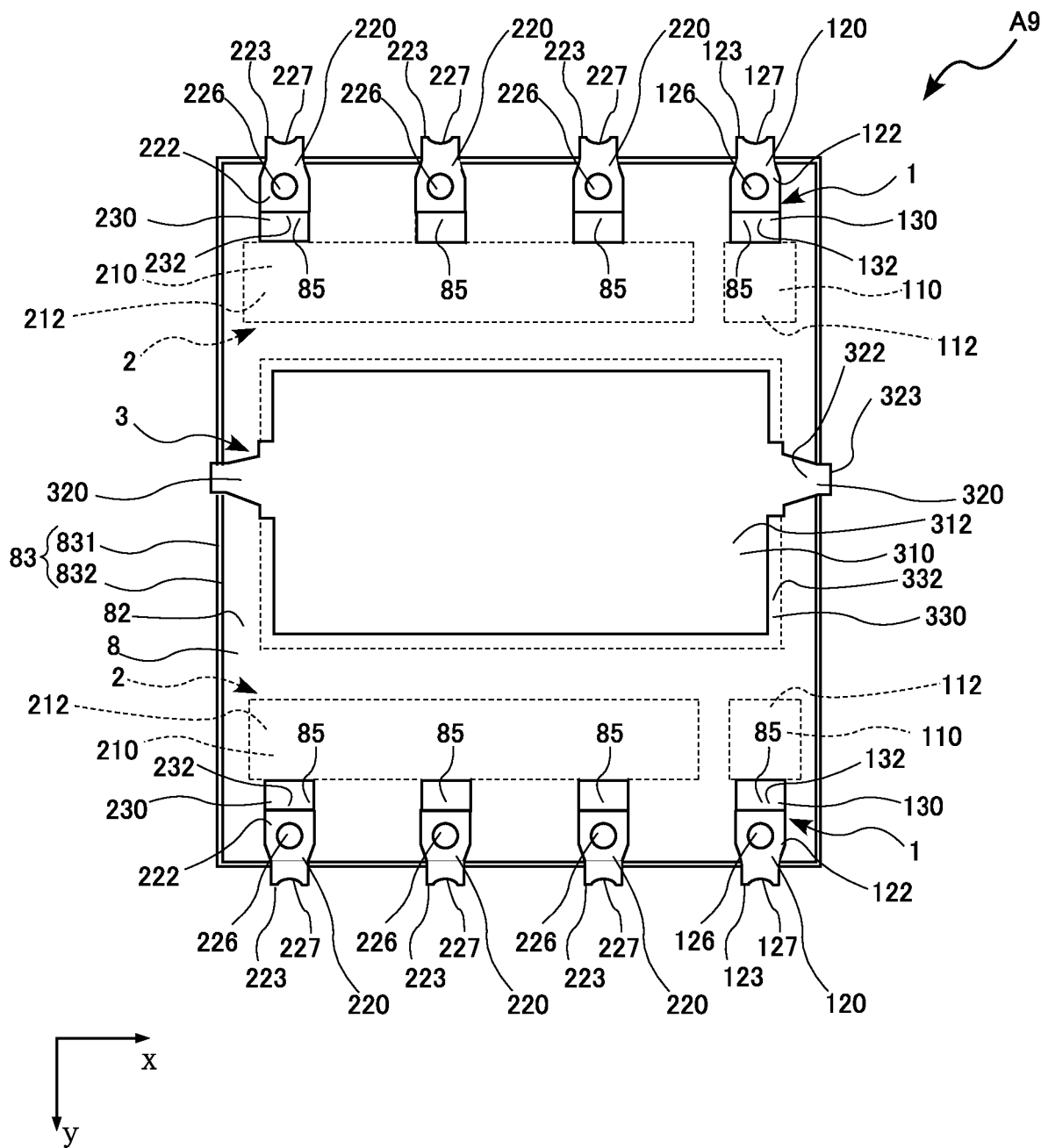
FIG. 24 is a bottom view showing a semiconductor device according to a ninth embodiment of the present disclosure.

A semiconductor device A9 according to a ninth embodiment of the present disclosure is described below with reference to FIG. 24. In FIG. 24, the elements that are identical or similar to those of the semiconductor device A1 are denoted by the same reference signs, and descriptions thereof are omitted. FIG. 24 is a bottom view of the semiconductor device A9, which corresponds to FIG. 4 that shows the semiconductor device A1 according to the first embodiment.

The semiconductor device A9 according to the present embodiment differs from the semiconductor device A1 in that the first lead 1 and the second leads 2 are disposed on each side of the third lead 3 in the y direction. In the present embodiment, the third lead 3 is disposed at the center of the semiconductor device A1 in the y direction, and the third-lead terminal parts 320 are not disposed at the end surfaces of the mount part 310 in the y direction. On each side of the third lead 3 in the y direction, the first lead 1 and the second leads 2 are disposed.

The present embodiment provides the same effects as those of the first embodiment.

Figure 25:
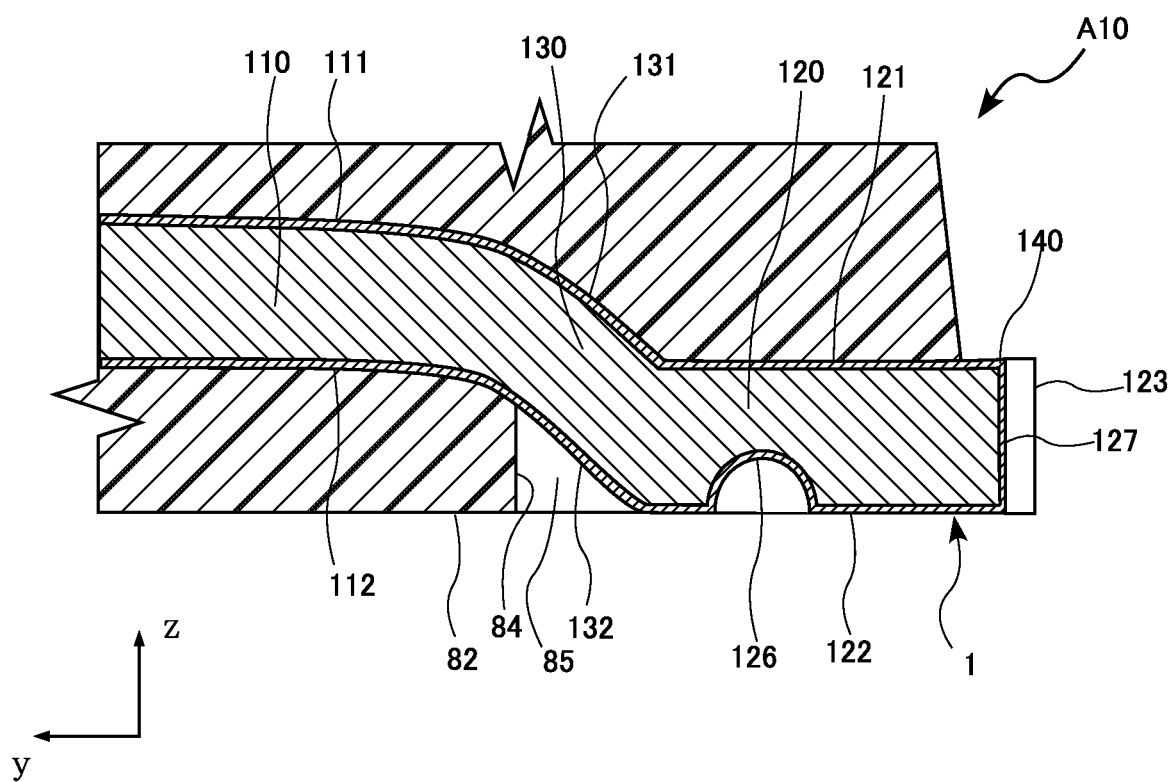
FIG. 25 is an enlarged sectional view showing a part of a semiconductor device according to a tenth embodiment of the present disclosure.

A semiconductor device A10 according to a tenth embodiment of the present disclosure is described below with reference to FIG. 25. In FIG. 25, the elements that are identical or similar to those of the semiconductor device A1 are denoted by the same reference signs, and descriptions thereof are omitted. FIG. 25 is an enlarged sectional view showing a part of a semiconductor device A10, which corresponds to FIG. 10 that shows the semiconductor device A1 according to the first embodiment.

The semiconductor device A10 according to the present embodiment differs from the semiconductor device A1 in configuration of the first lead 1. In the present embodiment, the wire bonding part 110 and the first-lead connecting part 130 of the first lead 1 are not formed by half etching but formed by stamping. That is, the wire bonding part 110, the first-lead terminal part 120 and the first-lead connecting part 130 are provided by forming the first lead 1 by bending a plate-like member having a constant thickness. Accordingly, the thickness of the wire bonding part 110 and the first-lead connecting part 130 are the same as that of the first-lead terminal part 120. The wire bonding part 110 is located closer to the resin front surface 81 than the first-lead terminal part 120 is. The wire bonding part 110 and the first-lead terminal part 120 are connected by an inclined part, which provides the first-lead connecting part 130. A recess 85 is defined by the first-lead connecting-part back surface 132 and the interior side surfaces 84 of the sealing resin 8. Note that the recess 126 may be formed during the stamping process, which is preferable for enhanced efficiency.

In the present embodiment again, in bonding the first-lead terminal part 120 to the circuit wiring 91 using the solder 92, the solder fills the recess 85, forming the second solder fillet 922. This reduces formation of a crack in the solder or separation of the solder 92 from the first-lead terminal-part back surface 122 due to thermal stress.

Figure 26:
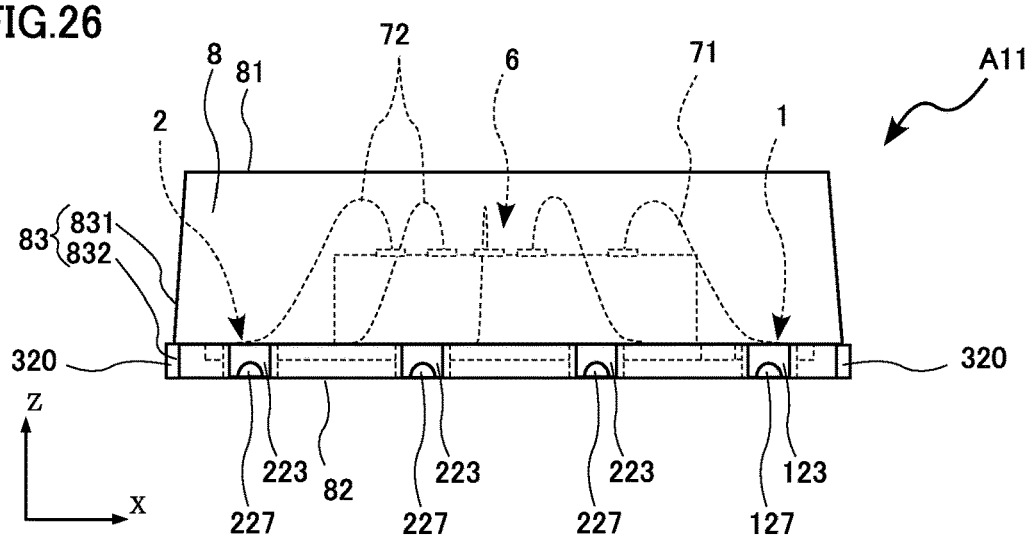
FIG. 26 is a front view showing a semiconductor device according to an eleventh embodiment of the present disclosure.
Figure 27:
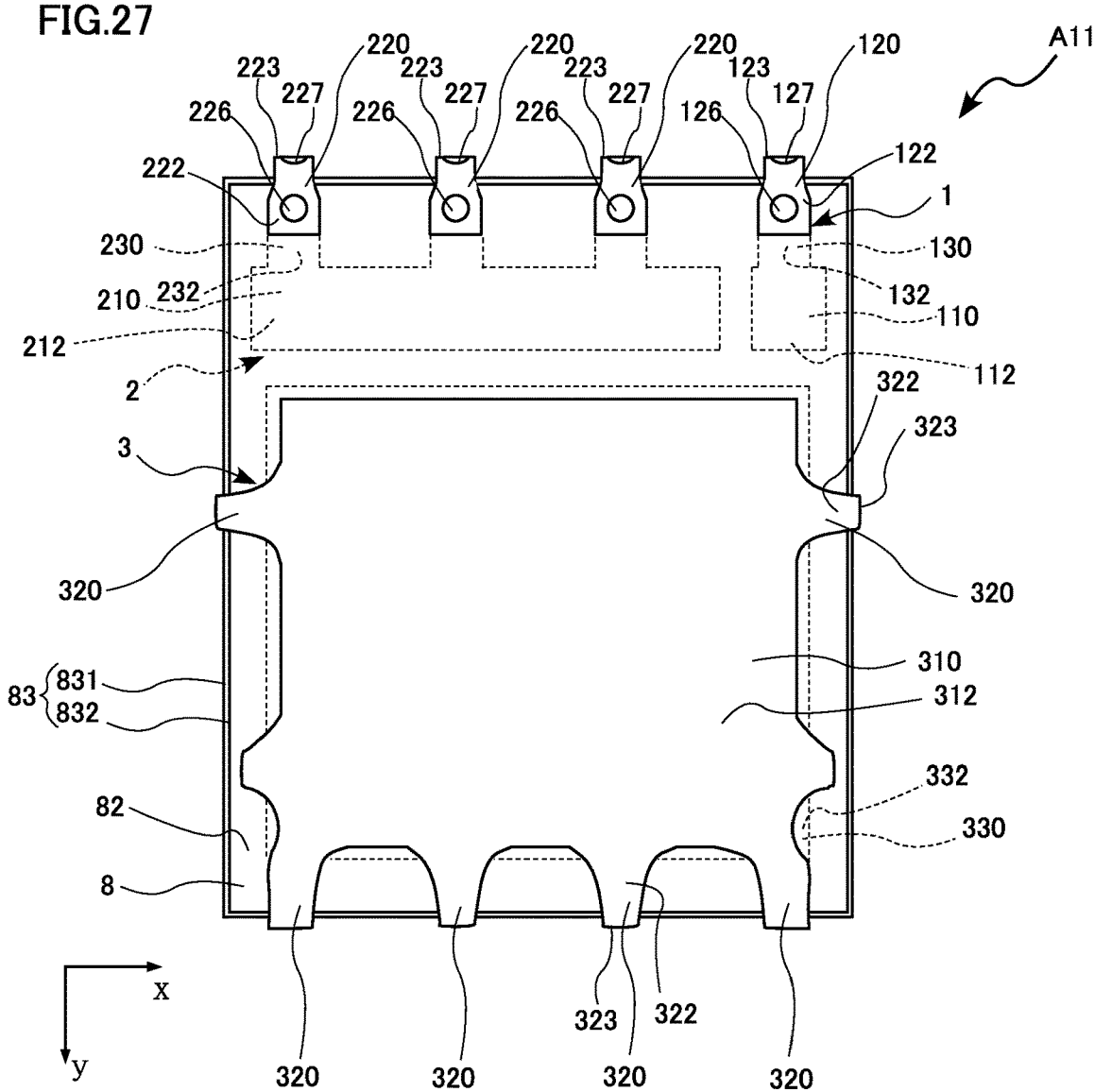
FIG. 27 is a bottom view showing the semiconductor device according to the eleventh embodiment of the present disclosure.
Figure 28:
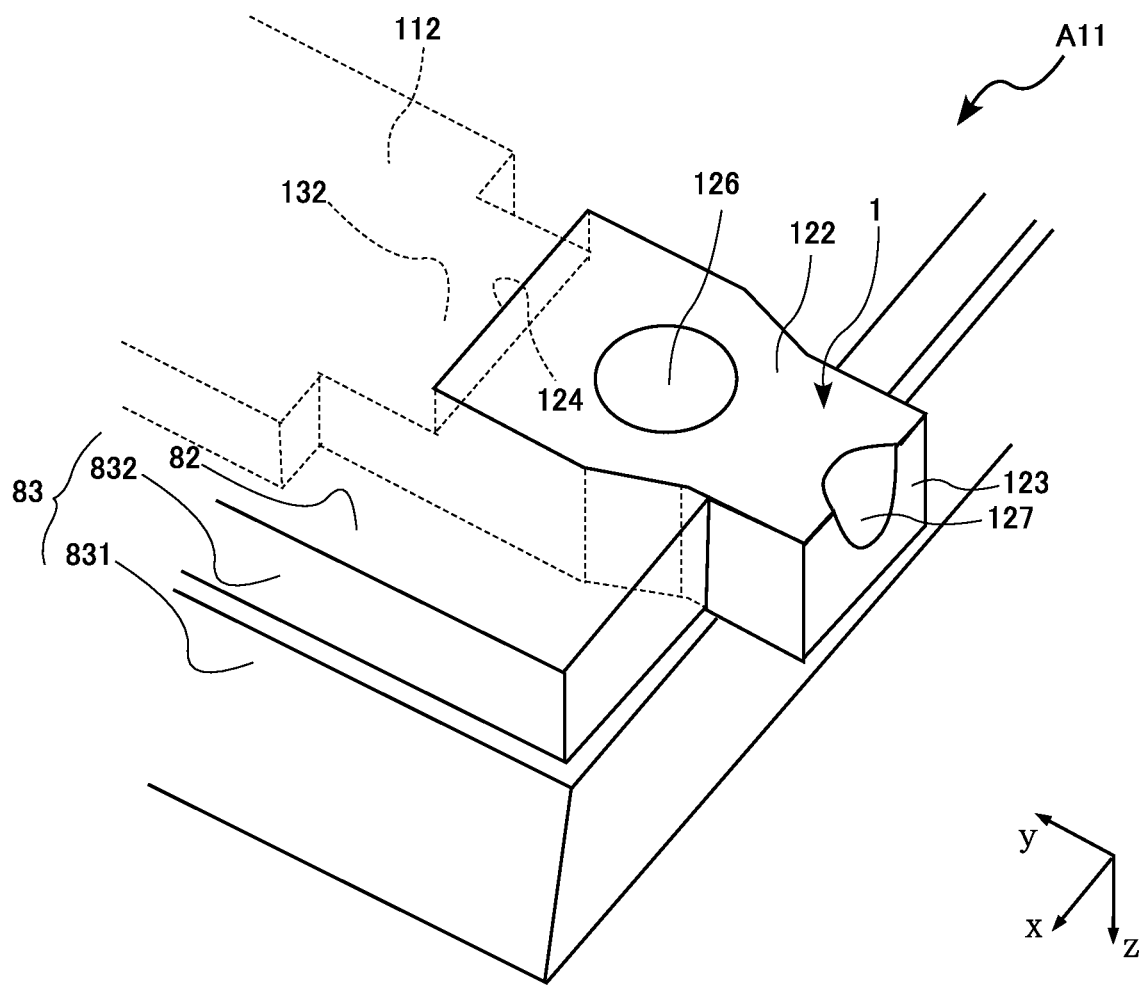
FIG. 28 is a perspective view showing the semiconductor device according to the eleventh embodiment of the present disclosure.

A semiconductor device A11 according to an eleventh embodiment of the present disclosure is described below with reference to FIGS. 26-28. In FIGS. 26-28, the elements that are identical or similar to those of the semiconductor device A1 are denoted by the same reference signs, and descriptions thereof are omitted. FIG. 26 is a front view showing the semiconductor device A11, which corresponds to FIG. 3 that shows the semiconductor device A1 according to the first embodiment. FIG. 27 is a bottom view showing the semiconductor device A11, which corresponds to FIG. 4 that shows the semiconductor device A1 according to the first embodiment. FIG. 28 is a perspective view showing the semiconductor device A11, which corresponds to FIG. 11 that shows the semiconductor device A1 according to the first embodiment.

The semiconductor device A11 according to the present embodiment differs from the semiconductor device A1 in configuration of the end-surface recess 127, 227 and the third lead 3. Further, the semiconductor device A11 does not have a recess 85. In the present embodiment, the end-surface recess 127 does not extend from one end to the other end of the first-lead terminal-part end surface 123 in the z direction but extends from one end (lower end in FIG. 26) to an intermediate point in the first-lead terminal-part end surface 123. The end-surface recess 127 is semicircular as viewed in the y direction. The end-surface recess 127 can be made by forming a semi-spherical (or substantially spherical) recess instead of a through-hole in a lead frame followed by cutting the lead frame at the (semi-)spherical recess. The end-surface recesses 227 have the same configuration as the end-surface recess 127. As shown in FIG. 27, in the present embodiment, each of the third-lead terminal-part back surface 322 of the third lead 3 has a curved shape, so that the region of the third lead 3 that is exposed from the resin back surface 82 has a shape with curved recess extending inward from the third-lead terminal-part end surfaces 323. As will be understood from FIGS. 27 and 28, the semiconductor device A11 does not have a recess 85.

In the present embodiment, the first-lead terminal-part end surface 123 has the end-surface recess 127 that extends from one end (the end closer to a circuit board to which the device is to be mounted) to an intermediate point of the first-lead terminal-part end surface 123 in the z direction. The end-surface recess 127 having such a configuration allows the first solder fillet 921 to be formed on the outer side of the first-lead terminal part 120 in the y direction in the process of mounting the first-lead terminal part 120 to the circuit wiring 91 using solder 92. This reduces formation of a crack in the solder 92 or separation of the solder 92 from the first-lead terminal-part back surface 122 due to thermal stress. Moreover, although the semiconductor device A11 does not have the recess 85, it has the recess 126. In bonding the first-lead terminal part 120 to the circuit wiring 91 using the solder 92, the solder fills the recess 126, forming the filling part 923. This also reduces formation of a crack in the solder 92 or separation of the solder 92 from the first-lead terminal-part back surface 122 due to thermal stress.

Figure 29:
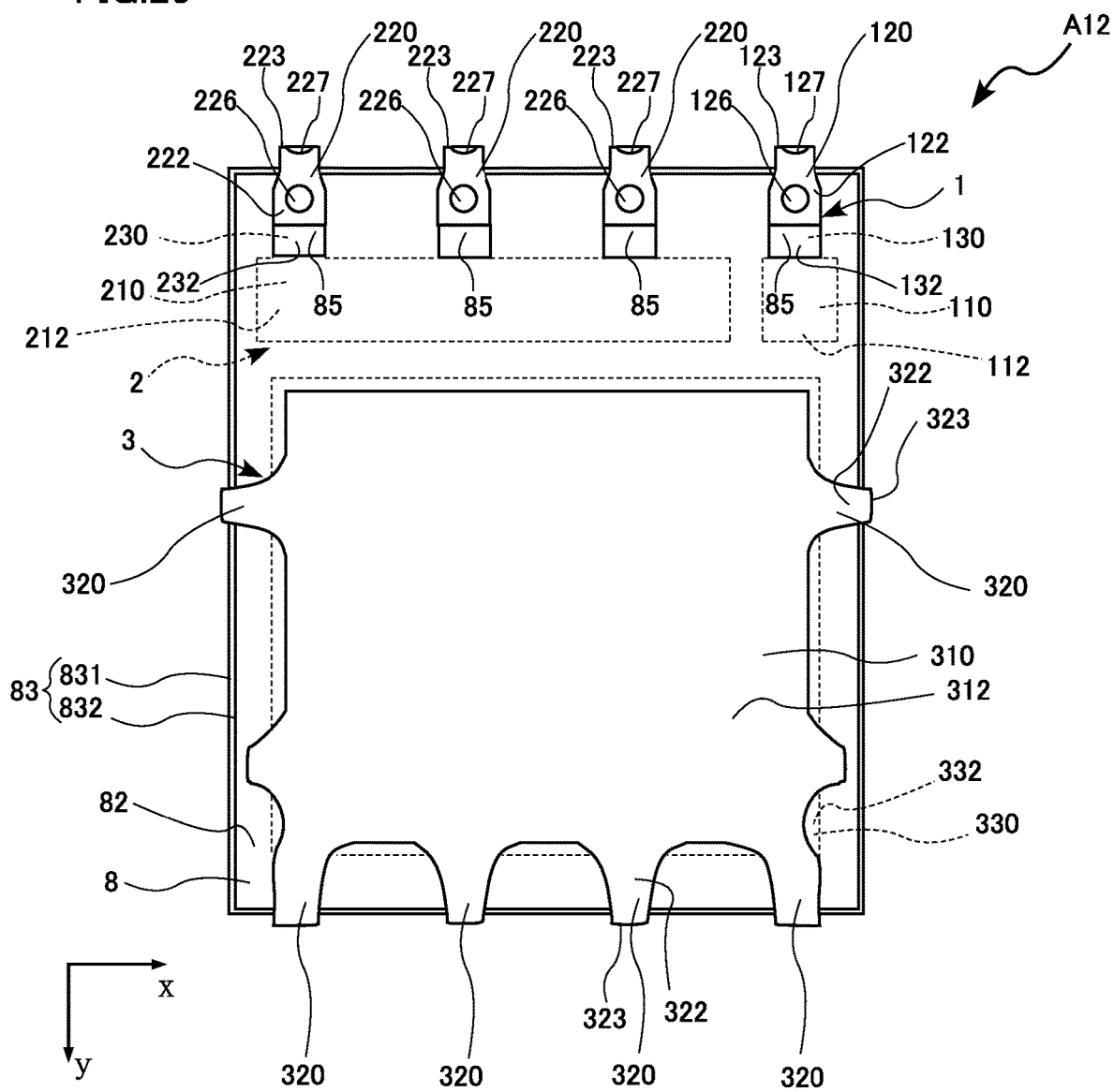
FIG. 29 is a bottom view showing a semiconductor device according to a twelfth embodiment of the present disclosure.
Figure 30:
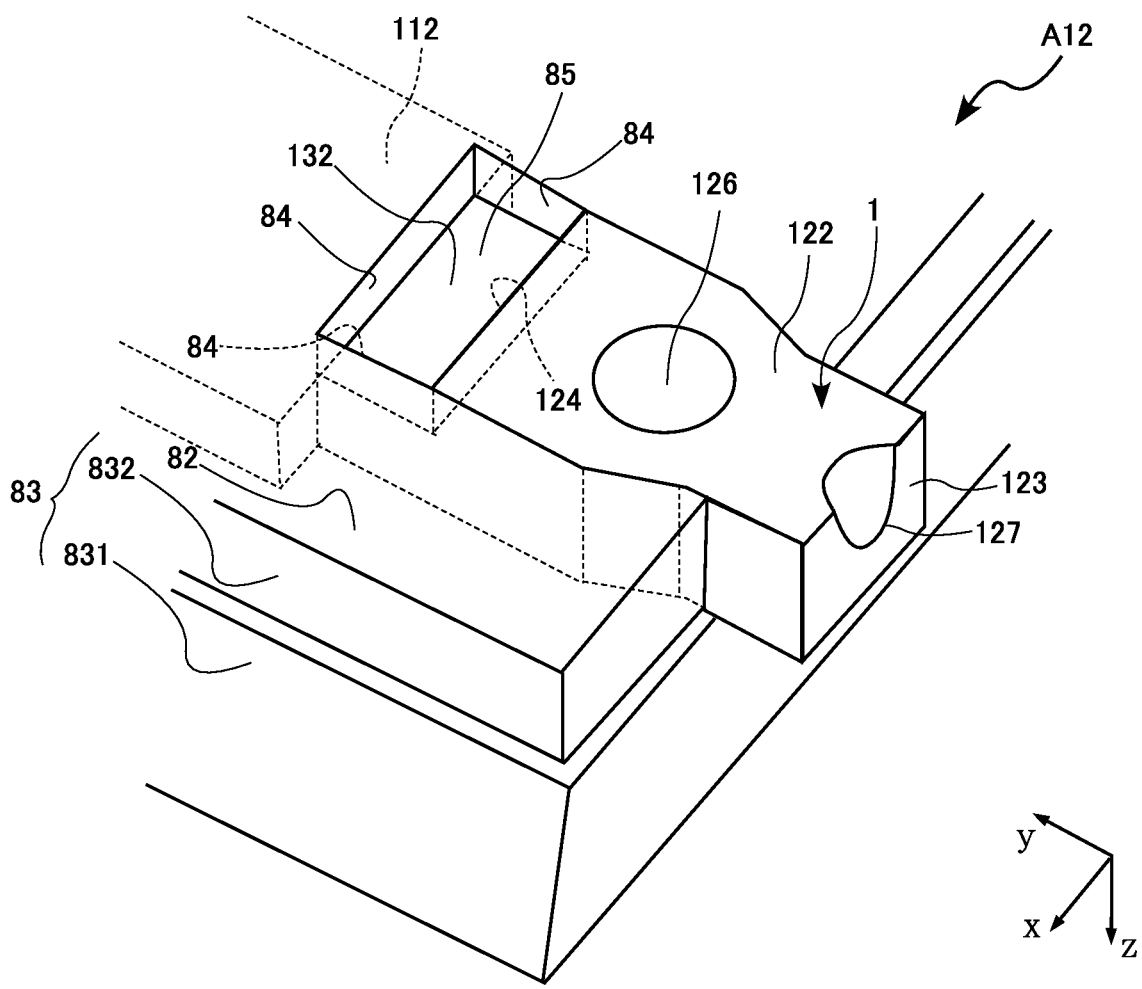
FIG. 30 is a perspective view showing the semiconductor device according to the twelfth embodiment of the present disclosure.

A semiconductor device A12 according to a twelfth embodiment of the present disclosure is described below with reference to FIGS. 29 and 30. In FIGS. 29 and 30, the elements that are identical or similar to those of the semiconductor device A1 are denoted by the same reference signs, and descriptions thereof are omitted. FIG. 29 is a bottom view of the semiconductor device A12, which corresponds to FIG. 4 that shows the semiconductor device A1 according to the first embodiment. FIG. 30 is a perspective view showing the semiconductor device A12, which corresponds to FIG. 11 that shows the semiconductor device A1 according to the first embodiment.

The semiconductor device A12 has the configuration obtained by adding the recesses 85 to the configuration of the semiconductor device A11 according to the eleventh embodiment. That is, the semiconductor device A12 differs from the semiconductor device A1 in shape of the end-surface recesses 127, 227 and shape of the third lead 3.

The semiconductor device A12 according to the present embodiment further includes recesses 85 in addition to the components or parts of the semiconductor device A11. In the present embodiment again, in bonding the first-lead terminal part 120 to the circuit wiring 91 using the solder 92, the solder fills the recess 85, forming the second solder fillet 922. This reduces formation of a crack in the solder 92 or separation of the solder 92 from the first-lead terminal-part back surface 122 due to thermal stress.

The present disclosure is applicable to various semiconductor devices of a surface-mounted type, regardless of the type, number and arrangement of the semiconductor elements, the number and arrangement of the leads, and the number and arrangement of the terminal parts. The present disclosure is especially effective when the bond area between a terminal part exposed from the sealing resin and a circuit wiring is small.

The semiconductor device according to the present disclosure is not limited to the foregoing embodiments. The specific structure of each part of the semiconductor device according to the present disclosure may be varied in various ways.

Clause 1.

A semiconductor device comprising:
  a semiconductor element;
  a first lead electrically connected to the semiconductor element;
  a sealing resin that covers the semiconductor element and a part of the first lead, the sealing resin including a resin front surface, a resin back surface opposite to the resin front surface in a thickness direction, and a resin side surface connecting the resin front surface and the resin back surface to each other; and
  at least one recess formed in a surface that is flush with the resin back surface,
  wherein the recess comprises apart of the first lead that is exposed from the resin back surface, and
  the recess has an outer edge that forms a closed shape, as viewed in the thickness direction, within a region that includes the resin back surface and the first lead.

Clause 2.

The semiconductor device according to clause 1, wherein the first lead includes a terminal part that has a terminal-part back surface and a terminal-part end surface, the terminal-part back surface being flush with the resin back surface, the terminal-part end surface being exposed from the resin side surface, and the recess is formed in the terminal-part back surface.

Clause 3.

The semiconductor device according to clause 2, wherein the recess is circular as viewed in the thickness direction.

Clause 4.

The semiconductor device according to clause 2, wherein the recess is rectangular as viewed in the thickness direction.

Clause 5.

The semiconductor device according to clause 1, wherein the first lead includes a terminal part that has a terminal-part back surface and a terminal-part end surface, the terminal-part back surface being flush with the resin back surface, the terminal-part end surface being exposed from the resin side surface,
  the terminal-part back surface is formed with a groove that is parallel to the terminal-part end surface, and
  the recess is formed by the groove and the sealing resin.

Clause 6.

The semiconductor device according to any one of clauses 2-5, wherein the at least one recess comprises a plurality of recesses.

Clause 7.

The semiconductor device according to clause 1, wherein the first lead includes a terminal part and a connecting part connected to the terminal part, the terminal part including a terminal-part back surface that is flush with the resin back surface, a terminal-part end surface exposed from the resin side surface, and a terminal-part second end surface facing away from the terminal-part end surface, the connecting part includes a connecting-part back surface facing in a direction in which the terminal-part back surface faces and located closer to the resin front surface than the terminal-part back surface is in the thickness direction, and the recess is formed by the connecting-part back surface, the terminal-part second end surface and the sealing resin.

Clause 8.

The semiconductor device according to clause 7, wherein an entirety of the connecting-part back surface is exposed from the resin back surface.

Clause 9.

The semiconductor device according to clause 7 or 8, wherein the recess is rectangular as viewed in the thickness direction.

Clause 10.

The semiconductor device according to clause 7, wherein the recess is semicircular as viewed in the thickness direction.

Clause 11.

The semiconductor device according to any one of clauses 2-10, wherein the terminal-part end surface projects from the resin side surface.

Clause 12

The semiconductor device according to any one of clauses 2-10, wherein the terminal-part end surface is flush with the resin side surface.

Clause 13.

The semiconductor device according to any one of clauses 2-12, wherein the terminal-part end surface includes an end-surface recess extending in the thickness direction.

Clause 14.

The semiconductor device according to any one of clauses 1-13, further comprising a plating layer formed in at least a part of the recess.

Clause 15

The semiconductor device according to any one of clauses 1-14, further comprising: a second lead electrically connected to the semiconductor element; and a third lead on which the semiconductor element is mounted, wherein the first lead and the second lead are arranged between the third lead and the resin side surface.

Clause 16.

The semiconductor device according to clause 15, wherein the semiconductor element includes a surface that faces the third lead and is formed with an electrode electrically connected to the third lead.

Clause 17.

The semiconductor device according to clause 16, wherein the semiconductor element comprises a transistor.

The invention claimed is:

1. A semiconductor device comprising:

a semiconductor chip;

at least one lead electrically connected to the semiconductor chip;

a sealing resin that covers the semiconductor chip and a part of the lead, the sealing resin including a resin front surface and a resin back surface opposite to the resin front surface in a thickness direction; and an island portion on which the semiconductor chip is mounted, wherein the lead includes an end portion formed with a cut-out recessed inward in plan view, while also including a thin-walled portion that is smaller in thickness than a remaining portion of the lead, wherein the lead includes an upper surface, the end portion of the lead includes a first lower surface, and the thin-walled portion of the lead includes a second lower surface, the second lower surface being offset toward the upper surface of the lead with respect to the first lower surface, wherein the cut-out is at least partially round in plan view, and wherein the sealing resin comprises a first resin side surface, a second resin side surface and a third resin side surface each of which is connected to the resin front surface and the resin back surface, and the island portion is formed with a plurality of protrusions each protruding outward from one of the first, second and third resin side surfaces in plan view.

2. The semiconductor device according to claim 1, wherein the semiconductor chip is provided with a control electrode and an output electrode, and the at least one lead comprises a first lead and a second lead, the first lead being electrically connected to the control electrode, the second lead being electrically connected to the output electrode.

3. The semiconductor device according to claim 2, further comprising a wire that electrically connects the control electrode of the semiconductor chip to the first lead.

4. The semiconductor device according to claim 3, further comprising an electroconductive path that electrically connects the output electrode of the semiconductor chip to the second lead, wherein the electroconductive path is smaller in resistance than the wire.

5. The semiconductor device according to claim 4, wherein each of the first, second and third resin side surfaces is inclined with respect to the thickness direction.

6. The semiconductor device according to claim 5, wherein the first lower surface of the end portion of the lead is formed with a recess having an outer edge that forms a closed shape in plan view.

7. The semiconductor device according to claim 6, wherein the recess is circular in plan view.

8. The semiconductor device according to claim 7, further comprising an additional recess spaced apart from the recess formed in the first lower surface, wherein the additional recess is defined by a part of the end portion of the lead, a part of the thin-walled portion of the lead and a part of the sealing resin.

9. The semiconductor device according to claim 8, wherein the additional recess is rectangular in plan view.

10. The semiconductor device according to claim 9, wherein the first lower surface of the end portion of the lead is flush with the resin back surface.

11. The semiconductor device according to claim 10, wherein the cut-out extending in the thickness direction.

12. The semiconductor device according to claim 11, further comprising a plating layer formed in at least a part of the cut-out.

13. The semiconductor device according to claim 2, wherein the first lead and the second lead comprise respective inner ends that face a same side of the island portion.

14. The semiconductor device according to claim 13, wherein the semiconductor chip is provided with an input electrode opposite to the output electrode in the thickness direction, the input electrode being electrically connected to the island portion.

15. The semiconductor device according to claim 14, wherein the semiconductor chip comprises a transistor.

16. The semiconductor device according to claim 15, wherein the electroconductive path comprises a plurality of wires each of which is bonded at an end to the output electrode of the semiconductor chip and bonded at an opposite end to the second lead.

17. The semiconductor device according to claim 16, wherein the output electrode is greater in area than the control electrode in plan view.

\* \* \* \* \*